United States Patent
Hastings et al.

(10) Patent No.: US 12,236,319 B2
(45) Date of Patent: Feb. 25, 2025

(54) QUANTUM CODE WITH PAIRWISE CHECKS

(71) Applicant: Microsoft Technology Licensing, LLC, Redmond, WA (US)

(72) Inventors: Matthew Hastings, Seattle, WA (US); Jeongwan Haah, Redmond, WA (US)

(73) Assignee: Microsoft Technology Licensing, LLC, Redmond, WA (US)

(*) Notice: Subject to any disclaimer, the term of this patent is extended or adjusted under 35 U.S.C. 154(b) by 0 days.

(21) Appl. No.: 17/364,812

(22) Filed: Jun. 30, 2021

(65) Prior Publication Data

US 2023/0027698 A1 Jan. 26, 2023

(51) Int. Cl.
| | |
|---|---|
| *G06N 10/70* | (2022.01) |
| *H03M 13/11* | (2006.01) |
| *G06N 10/00* | (2022.01) |
| *H03M 13/00* | (2006.01) |
| *H03M 13/39* | (2006.01) |

(52) U.S. Cl.
CPC ........ *G06N 10/70* (2022.01); *H03M 13/1102* (2013.01); *H03M 13/1191* (2013.01); *G06N 10/00* (2019.01); *H03M 13/3944* (2013.01); *H03M 13/611* (2013.01)

(58) Field of Classification Search
CPC .............. G06N 10/70; H03M 13/1102; H03M 13/1191
See application file for complete search history.

(56) References Cited

U.S. PATENT DOCUMENTS

| | | | |
|---|---|---|---|
| 2005/0133780 A1* | 6/2005 | Azuma | G06N 10/00 257/13 |
| 2007/0290901 A1* | 12/2007 | Hekstra | G11B 20/1426 341/94 |
| 2019/0044543 A1* | 2/2019 | Chamberland | G06N 10/00 |
| 2020/0341837 A1* | 10/2020 | Cross | G06F 11/10 |
| 2021/0019223 A1* | 1/2021 | Chamberland | G06F 11/1048 |

OTHER PUBLICATIONS

Yi-Chan Lee Courtney G Brell and Steven T Flammia; Topological quantum error correction in the Kitaev honeycomb model; Published Aug. 23, 2017; Journal of Statistical Mechanics: Theory and Experiment, vol. 2017, Aug. 2017 (Year: 2017).*

Christopher Chamberlain, Guanyu Zhu, Theodore J. Yoder, Jared B. Hertzberg and Andrew W. Cross, Topological and subsystem codes on low-degree graphs with ag qubits, [Submitted on Jul. 22, 2019 (v1), last revised Dec. 24, 2019 (this version, v2)] (Year: 2019).*

"Clifford gates" https://en.wikipedia.org/wiki/Clifford_gates, 2022 (Year: 2022).*

Emily Grumbling and Mark Horowitz; Quantum Computing: Progress and Prospects (2018); Copyright 2018 by the National Academy of Sciences (Year: 2018).*

(Continued)

*Primary Examiner* — Joseph D Torres
(74) *Attorney, Agent, or Firm* — Klarquist Sparkman, LLP

(57) ABSTRACT

A quantum error correcting code with dynamically generated logical qubits is provided. When viewed as a subsystem code, the code has no logical qubits. Nevertheless, the measurement patterns generate logical qubits, allowing the code to act as a fault-tolerant quantum memory. Each measurement can be a two-qubit Pauli measurement.

17 Claims, 9 Drawing Sheets

(56) References Cited

OTHER PUBLICATIONS

Daniel Gottesman; Stabilizer Codes and Quantum Error Correction; California Institute of Technology Pasadena, California 2008 (Submitted May 21, 1997) (Year: 1997).*
Eleanor Rieffel and Wolfgang Polak, Quantum Computing; The MIT Press 2011 (Year: 2011).*
The Authoritative Dictionary of IEEE Standards Terms, Seventh Edition, Published by Standards Information Network IEEE Press, Copyright 2000 by the Institute of Electrical and Electronics Engineers, Inc. Published Dec. 2000. (Year: 2000).*
Aguado and Kouwenhoven, "Majorana qubits for topological quantum computing," *Physics Today*, vol. 73, No. 6, pp. 44-50 (Jun. 2020).
Bravyi and Haah, "Analytic and numerical demonstration of quantum self-correction in the 3d cubic code," *Phys. Rev. Lett.*, vol. 111, No. 20, 40 pages (Nov. 2013).
Bravyi et al., "Subsystem surface codes with three-qubit check operators," *Quantum Information and Computation*, vol. 13, No. 11 & 12, pp. 963-985 (Nov. 2013).
Dennis et al., "Topological quantum memory," *J. Math. Phys.*, vol. 43, No. 9, pp. 4452-4505 (Aug. 20, 2002).
Fidkowski et al., "How dynamical quantum memories forget," *Quantum*, vol. 5, 24 pages (Jan. 17, 2021).
Gottesman, "Stabilizer codes and quantum error correction," Thesis, California Institute of Technology, retrieved from https://arxiv.org/abs/quant-ph/9705052v1, 122 pages (May 21, 1997).
Gullans and Huse, "Dynamical purification phase transition induced by quantum measurements," *Physical Review X*, vol. 10, No. 4, pp. 041020-1-041020-28 (Oct. 28, 2020).
Haah, "Commuting pauli hamiltonians as maps between free modules," *Comm. Math. Phys.*, vol. 324, No. 2, pp. 351-399 (Oct. 10, 2013).
Karzig et al., "Scalable designs for quasiparticle-poisoning-protected topological quantum computation with majorana zero modes," *Physical Review B*, vol. 95, No. 23, 34 pages (Jun. 23, 2017).
Kawagoe and Levin, "Microscopic definitions of anyon data," *Physical Review B*, vol. 101, No. 11, 24 pages (Mar. 9, 2020).
Kitaev, "Anyons in an exactly solved model and beyond," *Annals of Physics*, vol. 321, No. 1, pp. 2-111 (Jan. 2006).
Kitaev, "Fault-tolerant quantum computation by anyons," *Annals of Physics*, vol. 303, No. 1, pp. 2-30 (Jan. 2003).
Kivelson et al., "2e or not 2e: flux quantization in the resonating valence bond state," *EPL (Europhysics Letters)* vol. 6, No. 4, pp. 353-358 (Jun. 15, 1988).
Li et al., "Quantum Zeno effect and the many-body entanglement transition," *Phys. Rev. B*, vol. 98, No. 20, 10 pages (Nov. 2, 2018).
Poulin, "Stabilizer formalism for operator quantum error correction," *Physical Review Letters*, vol. 95, No. 23, 5 pages (Dec. 2005).
Skinner et al., "Measurement-induced phase transitions in the dynamics of entanglement," *Phys. Rev. X*, vol. 9, pp. 031009-1-031009-21 (Jul. 2019).
Chao, et al., "Optimization of the Surface Code Design for Majorana-Based Qubits", In Repository of arXiv:2007.00307v2, Oct. 26, 2020, 19 Pages.
Hastings, et al., "Dynamically Generated Logical Qubits", In Repository of arXiv:2107.02194v2, Oct. 12, 2021, 19 Pages.
Kargarian, et al., "Topological Color Codes and Two-Body Quantum Lattice Hamiltonians", In Repository of arXiv:0906.4127v2, Mar. 6, 2010, 58 Pages.
Lee, et al., "Topological Quantum Error Correction in the Kitaev Honeycomb Model", In Repository of arXiv:1705.01563, Aug. 31, 2017, 34 Pages.
"International Search Report and Written Opinion Issued in PCT Application No. PCT/US2022/029663", Mailed Date: Sep. 9, 2022, 14 Pages.
PCT/US2022/029663 / WO 2023/278025, May 17, 2022 / Jan. 5, 2023.

* cited by examiner

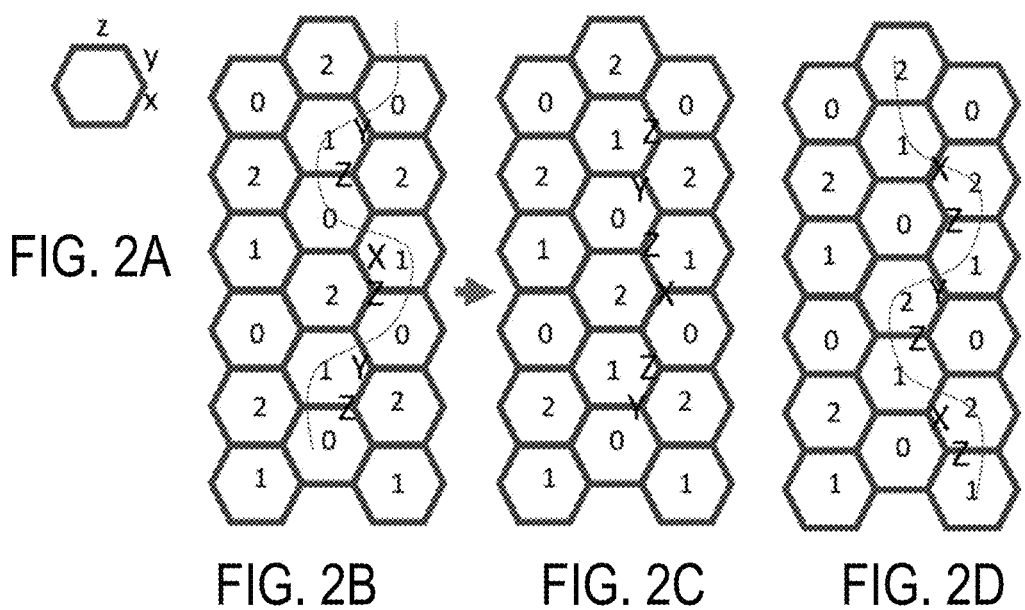

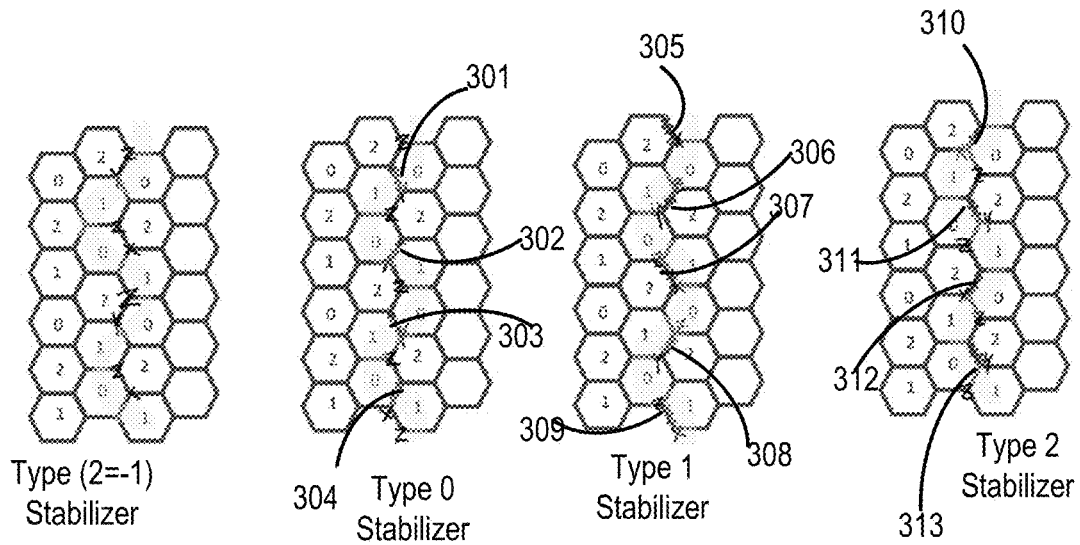
Type (2=-1) Stabilizer    FIG. 3A
304 Type 0 Stabilizer    FIG. 3B
Type 1 Stabilizer    FIG. 3C
Type 2 Stabilizer    FIG. 3D
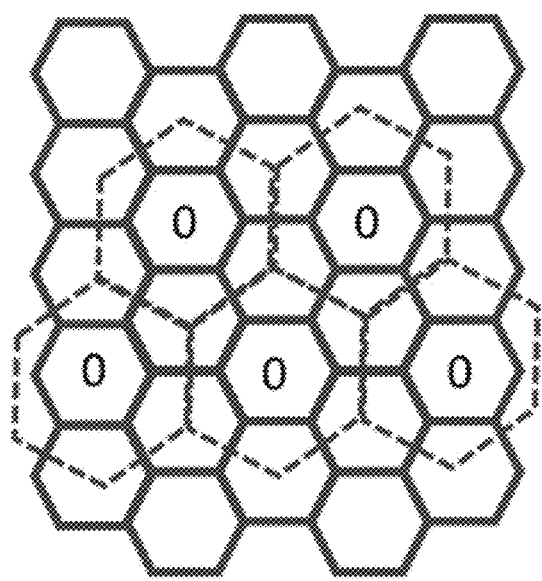
FIG. 4

QUANTUM CODE WITH PAIRWISE CHECKS

FIELD OF THE DISCLOSURE

The disclosure pertains to error correcting codes for quantum computing.

BACKGROUND

Various kinds of quantum error correcting codes have been proposed. The simplest kind of code is a stabilizer code, where the checks are products of Pauli operators which are mutually commuting. The toric code is a standard example of this type of code. Implementing the toric code in two dimensions requires measurement of stabilizers which are products of at most four Pauli operators. It is possible to implement the toric code as a subsystem code using measurements of checks which are products of at most three Pauli operators. However, even codes based on products of three or more Pauli operators can be too complex for practical implementation, and alternative codes and coding methods are needed.

SUMMARY

Methods comprise associating each qubit in a set of qubits with a corresponding vertex of a hexagon in a hexagonal lattice, the hexagons of the lattice having edges in first, second, and third hexagon edge directions, defining first, second, and third checks corresponding to the first, second, and third hexagon edge directions, each of the first, second, and third checks corresponding to a different pair of two qubit Pauli operators, associating each hexagon with one of a first, second, or third hexagon label such that each hexagon is surrounded by hexagons having different hexagon labels, and assigning a connection label to each pair of qubits in the set of qubits, the connection label corresponding to a label of nearest hexagons connected by extending a hexagon edge from the vertices of the hexagons. The checks are applied to the pairs of qubits in sequence by, for all pairs of qubits having the first connection label, applying the first, second, or third checks based on the hexagon edge directions; for all pairs of qubits having the second connection label, applying the first, second, or third checks based on the hexagon edge directions; and for all pairs of qubits having the third connection label, applying the first, second, or third checks based on the hexagon edge directions. In some examples, an error is identified based on the applications of the checks. In some cases, the hexagonal lattice is planar or is defined on a three dimensional surface, Typically, in the first, second, and third checks are selected from XX, YY, ZZ, XY, YX, XZ, ZX, YZ, ZY, wherein X, Y, Z, correspond to single qubit Pauli operators. In some examples, the first, second, and third checks are implemented by measurements on Majorana tetrons, by two-qubit measurements, and/or by two-qubit Clifford gates and single qubit measurements.

Quantum computing systems comprise a plurality of gates, a plurality of qubits, and a controller coupled to apply a honeycomb code and identify an error based on the applied honeycomb code. In some examples, the honeycomb code is applied based on checks associated with respective honeycomb edge directions and connections of paired qubits that are adjacent as assigned to vertices of the honeycomb. In typical examples, the checks are first, second, and third checks and are selected from XX, YY, ZZ, XY, YX, XZ, ZX, YZ, ZY, wherein X, Y, Z, correspond to single qubit Pauli operators. In an example, the first, second, and third checks are the two qubit. Pauli X operator, the two qubit Pauli Y operator, and the Pauli two qubit Z operator. In some examples, the first, second, and third checks are implemented by measurements on Majorana tetrons, by two-qubit measurements and/or by two-qubit Clifford gates and single qubit measurements. The honeycomb code is based on a hexagonal lattice defined on a three dimensional surface or on a planar hexagonal lattice. The controller can be operable to identify an error based on the application of one or more of the checks.

Computer-readable storage devices have processor-executable instructions that are operable to establish a honeycomb code by assigning qubits to a hexagonal lattice, assigning cheeks to edges of the hexagonal lattice based on edge directions, and determining connections of pairs of adjacent qubits with adjacent cells of the hexagonal lattice, and to control a quantum processor to apply the honeycomb code by sequentially applying the associated checks to adjacent pairs of qubits based on the determined connections.

BRIEF DESCRIPTION OF THE DRAWINGS

FIG. 2A illustrates the three different types of edges, x, y, z depending on direction.

FIG. 2B illustrates a lattice and an outer logical operator of the instantaneous stabilizer group after a round r=0 mod 3.

FIGS. 2C-2D illustrate additional rounds.

FIGS. 3A-3D illustrate an outer logical operator over a period of measurement dynamics. The outer logical operator is effectively multiplied by a parallel inner logical operator after one period.

FIG. 4 illustrates that the ISG corresponds to a toric code after disentangling.

DETAILED DESCRIPTION

Figures 1A, 1B:
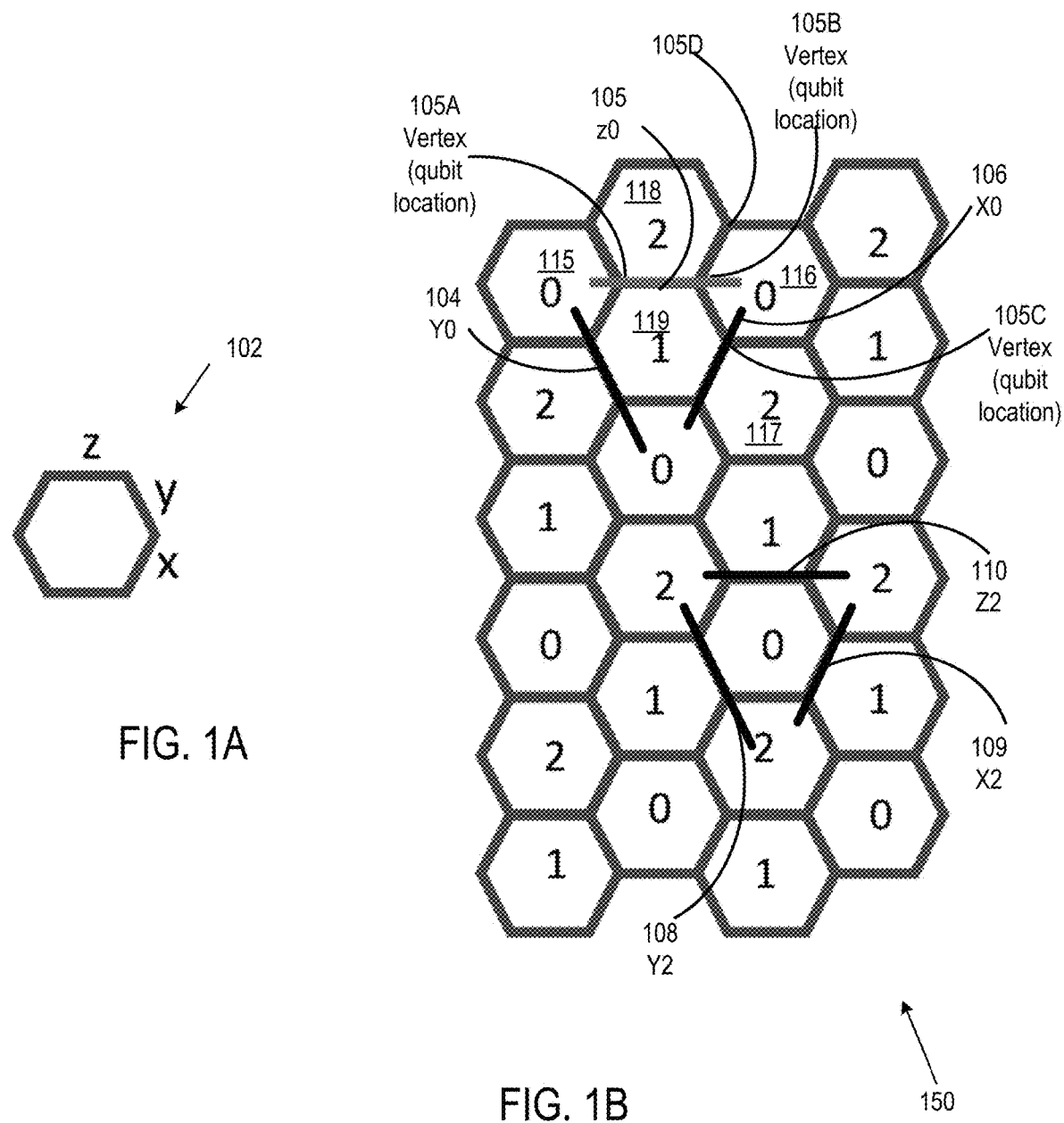
FIGS. 1A-1C illustrate a hexagonal lattice showing edge labeling of hexagons (FIG. 1A) and labeling of hexagons (FIGS. 1B-1C).

Disclosed herein are alternative codes and coding methods for quantum computers based on a so-called "honeycomb code" where checks are two-qubit Pauli operators. When regarded as a subsystem code, such a code does not have any logical qubits but still protects quantum information; indeed, on a torus it protects two logical qubits with a code distance proportional to the linear size of the torus. The simplicity of the code makes it useful for many applications, especially in architectures where the basic operation is a pairwise measurement such as Majorana devices. The disclosed approaches are described generally in an analytical framework followed by representative example embodiments.

Analytical Framework

The disclosed codes in which measurements are products of Paulis and a number of logical qubits is larger than the number that would be obtained when the code is viewed as a subsystem code, are referred to herein as codes with dynamically generated logical qubits, or "Floquet codes."

The disclosed dynamical codes are distinguishable from the kinds of codes produced by random monitored measurements interspersed with rapidly scrambling unitaries. The scrambling induced by the unitary evolution acts as an error correcting code there to protect information against the measurements and the combination of measurement and unitary can act as an encoder for an error correcting code. Due to the random nature of unitaries and measurements, it is not clear whether such a code would have a good decoder. These approaches are not suitable for fault tolerant applications, since they will not generally protect against weak external noise introduced during the measurement and unitary process. The reason is that the measurements are not chosen in such a way that external noise will leave a strong enough fingerprint in the measurement outcomes. The approaches disclosed herein have the property that there are certain linear relations between measurement outcomes at different times in the absence of noise, and from these linear relations, noise can be detected and corrected.

In Section 1, the honeycomb code is defined. Since the code has some unusual properties, in Section 2 a simpler one-dimensional code referred to as a "ladder code" is presented which can be analyzed more simply. Finally, in Section 3, it is demonstrated that error correction and even fault tolerance in the honeycomb code is possible.

1 The Honeycomb Code

In this section, the honeycomb code is introduced, specified by a time ordered sequence of check operators that are two-qubit Pauli operators. If we ignore the time ordering and regard it as a subsystem code, then the honeycomb code does not have any logical qubits. Nonetheless, we can identify a subspace of dimension 4 (two qubits) at any moment, and this subspace will be our logical qubits. Naturally, we are led to "instantaneous stabilizer groups" and their dynamics.

1.1 The Code

We consider qubits arranged on vertices of a hexagonal (also called a honeycomb) lattice with periodic conditions. The edges are of three different types x, y, z. At each vertex, three different types of edges meet. The simplest choice is to pick x, y, z to correspond to the three different directions of the edge. For each edge, we will define an operator called a "check" acting on the two qubits of the edge. For an x edge, the check is XX; for a y edge, the check is YY, and for a z edge, the check is ZZ. Remark: in everything that follows, it suffices that each check be a product of two, possibly different, Paulis (for example, XZ) such that for every qubit, each check involving that qubit involves a distinct Pauli operator on that qubit.

The hexagons of the honeycomb lattice are 3-colorable, meaning that we may label each hexagon by one of 0, 1, 2 such that two neighboring hexagons have different labels. Given this labeling of hexagons, we also label the edges by numbers 0, 1, 2 by the rule that every edge of label $a \in \{0, 1, 2\}$ connects two nearest hexagons of the same label a. If an edge of type a is slightly extended, its two endpoints would lie in hexagons of type a. Note then that every edge is given two different labels, a letter x, y, z and a number 0, 1, 2, so that there are 9 types of edges. FIG. 1A illustrates three different, types of edges, x, y, z of a hexagon depending on direction. FIG. 1B illustrates a hexagonal lattice. The hexagons are labeled by 0, 1, 2 as described. The slightly thicker longer line near the top connects two hexagons of type 0, and hence the edge under it is a type 0 edge. Labeling of edges and hexagons as shown in FIGS. 1A-1B is discussed in further detail below in Example 1.

The checks are measured in distinct rounds, measuring first all checks labeled by 0, then by 1, then by 2, repeating, so that in the r-th round checks labeled by r mod 3 are measured. Note that every qubit participates in some check at every round.

This completes the definition of the honeycomb code. The definition is perhaps unusual since a fixed subspace of the full Hilbert space of the qubits in which one would encode logical qubits is not identified. However, a useful subspace is dynamic as shown below.

1.2 Properties as Subsystem Code

A subsystem code is defined as follows. There are a set of operators (which correspond to measurements used in detecting and correcting errors) called checks. These checks are products of Pauli operators on qubits. The checks generate a group called the "gauge group". The center of the gauge group is called the "stabilizer group". The gauge group can then be generated by the stabilizer group and by some other group which is isomorphic to a tensor product of Pauli groups; this other group is regarded as acting on certain "gauge qubits". Nontrivial logical operators correspond to operators which commute with the gauge group but which are not in the stabilizer group.

At this point, a remark on terminology is necessary. The term "gauge" is highly overloaded, being used as above to describe a certain group in a subsystem code but also (and this will be useful for us later) to describe a "gauge field" in a topological quantum field theory (TQFT). Thus, when we use the terms "gauge group" and "gauge qubit", these will refer to the terms in the above paragraph. We will continue to call the operators that we measure "checks", rather than "gauge operators" as they are sometimes called. We reserve the term "gauge field" and "gauge string" for use in the sense of TQFT.

Consider the honeycomb code on a torus with $n_p$ hexagonal plaquettes. Then, there are $2n_p$ qubits. There are $3n_p$ edges; however, there is a redundancy of the checks since the product of all checks is the identity. Hence, the gauge group has dimension $3n_p-1$.

The product of checks on any cycle on the lattice is a stabilizer, and indeed these are all the stabilizers. (A 1-chain is an assignment of 0 or 1 to each edge of the lattice, and a 1-cycle, or simply a cycle for short, is a 1-chain whose boundary vanishes mod 2.) The stabilizers corresponding to homologically trivial paths are generated by paths on plaquettes, and we call the corresponding operators "plaquette stabilizers". However, there is again a redundancy, as the product of all those plaquette stabilizer is the identity. The stabilizer group is generated by these plaquette stabilizers as well as by stabilizers for two homologically nontrivial cycles wrapping different directions of the torus. Thus, the stabilizer group has dimension $n_p+1$.

Hence, there are $g=((3n_p-1)-(n_p+1))/2=n_p-1$ gauge qubits. Since the stabilizer group has dimension $s=n_p+1$ and $g+s$ is equal to the number of qubits, there are no logical operators when this code is regarded as a subsystem code.

1.3 Instantaneous Stabilizer Groups

Recall that given a state stabilized by a Pauli stabilizer group S, a measurement by a Pauli operator P projects the state to another Pauli stabilizer state, whose stabilizer group can be tracked as follows.
  (a) If $P \in S$ or $-P \in S$, then the measurement of P is deterministic and reveals $P = \pm 1$ and the stabilizer group remains the same.
  (b) If $P \notin S$ and $-P \notin S$, but if P commutes with every element of S, then the post-measurement stabilizer group S' is increased from S to include $\pm P$ ($S'=(S, \pm P)$), where the sign is given by the measurement outcome. When the underlying state is maximally mixed within the stabilized subspace, the two outcomes $\pm 1$ are equally probable.
  (c) If $P \in S$ and if P anticommutes with some element $Q \in S$, then the post-measurement stabilizer group does change but the size remains the same. Specifically, if $S=(S_0, Q)$ where $S_0$ is a subgroup of S consisting of those that commute with P, then the post-measurement stabilizer group is $S'=(S_0, \pm P)$ where the sign is given by the measurement outcome. The two outcomes are always equally probable.

Suppose we start in a maximally mixed state, which is a stabilizer state of the trivial stabilizer group, and begin measuring checks in the pattern above, starting with round 0. Here we assume that every measurement is noiseless; we will address effects of noise in Section 3. After any number of rounds, the state is a Pauli stabilizer state, specified by an "instantaneous stabilizer group (ISG)." Let us identify the ISG after each round of the honeycomb code. We will not consider signs of the stabilizers here in this section, though the signs will be important in Section 3. The product of the checks over all edges of any closed loop commutes with any check. In particular, each hexagon supports a weight 6 operator, which we call a plaquette stabilizer, that commutes with every check.

The key observation to understand what follows is that measuring checks in rounds r, r−1 will measure the plaquette stabilizers on plaquettes of type r+1 mod 3.
  1. The ISG is initially trivial (containing only the identity operator).
  2. After round 0, it is clear that the ISG S(0) is generated by the checks of type 0.
  3. After round 1, the ISG S(1) is generated by the checks of type 1 and the plaquette stabilizers on hexagons of type 2. To see this, note that the six qubits of a type 2 hexagon has not interacted with any other type 2 hexagon. Hence, it suffices to verify the claim for one hexagon of type 2. We add three checks to S(0) one by one, and the claim follows by applying (c) above twice and (b) once.
  4. After round 2, the ISG S(2) is generated by the checks of type 2 and the plaquette stabilizers of type 2 and type 0. The reason is similar: Since the plaquette stabilizers of S(1) commute with the type 2 checks, we may consider the subgroup of S(1) generated by the type 1 checks. The situation is the same as in the transition $S(0) \rightarrow S(1)$.
  5. On subsequent rounds $r \geq 3$, the ISG S(r) is generated by checks of type r mod 3 aid all the plaquette stabilizers. The proof is by induction: S(2) contains all the plaquette stabilizers of type 2 and 0, and the type 2 checks of S(2) and the type 3 checks at round 3 generates type 1 plaquette stabilizers and type 3 checks. For round r>3, we know S(r−1) contains all plaquette stabilizers. The type (r−1 mod 3) checks in S(r−1) and the type (r mod 3) checks at round r, replace the type (r−1 mod 3) checks with the type (r mod 3) checks.

It is crucial that for any r, the ISG S(r) never contains homologically nontrivial "long" loop operators. We have remarked that the product of all the checks along a closed loop commutes with every checks. Here, the loop can be a homologically nontrivial loop which is not the circumference of any combination of plaquettes. This long loop operator belongs to the center of the "gauge group" of the subsystem code, but our specific measurement dynamics keeps the long loop operators away from the instantaneous stabilizer group.

We will mainly consider the ISG for $r \geq 3$, when the ISG reaches a steady state depending only on r mod 3. If there are $n_p$ plaquettes on a torus, there are $n_p$ checks of types r mod 3, so we have given $2n_p$ generators for S(r). However, these generators are not independent: the product of all plaquette stabilizers is the identity and also the product of check of type r mod 3 with plaquette stabilizers of type r mod 3 is the identity. So, the ISG has dimension $2n_p-2$, and hence there is a $2^2=4$ dimensional subspace stabilized by ISG at any moment.

Indeed, the code described by the instantaneous stabilizer group is a toric code, up to a bounded-depth quantum circuit. Even disregarding error-correction properties of the honeycomb code, this may be a useful way to rapidly prepare toric code states using only 4 rounds of pairwise measurements (r=0, 1, 2, 3).

1.4 Logical Operators

FIG. 2A illustrates the three different types of edges, x, y, z depending on direction. FIG. 2B illustrates a lattice showing an outer logical operator of the instantaneous stabilizer group after a round r=0 mod 3. The operator is a product of Paulis on vertices. The label X, Y, Z on each vertex denotes the type of Pauli operator. The label can be worked out as follows: draw a closed path on the dual lattice, shown as the curvy line going between 0 and 1 hexagons. Then, for each edge that it crosses, of type x, y, z, draw the corresponding Pauli operator X, Y, Z on one of the two vertices in that edge, choosing this vertex so that every type 0 edge has an even number of Paulis on that edge. This choice guarantees that the operator commutes with checks on those edges. The arrow shows how the outer logical operator changes on round r+1 as illustrated in FIG. 2C: the operator to the right of the arrow is given by multiplying the arrow to the left by some checks on edges labeled 0, to get a logical operator of the instantaneous stabilizer group on round r+1. Multiplying by checks on edges labeled 0 is done so that it commutes. Finally, the lattice of FIG. 2D shows an outer logical operator on round r+1 constructed using a similar dual lattice construction; comparing the two outer logical operators (that of the lattices of FIGS. 2C-2D) shows that they differ by an inner logical operator.

With two logical qubits, we need to find a basis of four logical operators. One type of logical operators is (up to the instantaneous stabilizer group) the product of check operators on a homologically nontrivial cycle. This gives us two logical operators. We call these "inner logical operators" since they belong to the stabilizer group as a subsystem code. The other type of logical operator is shown in FIG. 2B. We call these "outer logical operators" since they do not belong to the stabilizer group as a subsystem code. Note that an outer logical operator is specific to a given round, and a full period of them is shown in FIGS. 3A-3D). Further the outer logical operator in fact depends on the history of check outcomes; we will elaborate on this below. The construction may seem mysterious but the Majorana representation that we discuss in a later section will make it much more clear. This gives us two more logical operators on a torus. The inner and outer logical operators act as logical X, Z operators on the two qubits, respectively. Of course, it is completely arbitrary which logical operator corresponds to logical X or Z.

We can distinguish inner and outer logical operators by their partial implementations. The outer logical operator has the property that if we terminate the logical operator to a string with endpoints, then at the endpoints it anticommutes with some plaquette stabilizers. The plaquette stabilizers form a static subgroup of ISG, which is the intersection of ISG over all rounds $r \geq 3$. (This static subgroup of ISG consists of all homologically trivial elements of the stabilizer group of the honeycomb code, regarded as a subsystem code.) The inner logical operator however can be terminated to a string with endpoints in a way that it commutes with all plaquette stabilizers, as we simply may take the product of gauge operators along an open path. Similar to the outer logical operators, an inner logical operator corresponds to a nontrivial homology cycle consisting of edges of the honeycomb lattice, and two inner logical operators of the same homology class are equivalent up to ISG.

The inner logical operator commutes with any checks, and hence if we initialize the logical qubits in an eigenstate of an inner logical operator, and later measure the inner logical operator, then we will retrieve the same eigenvalue. This means that the inner logical operator is independent of the measurement round r, even though the ISG is periodically changing.

In contrast, the dynamics of the outer logical operators is nontrivial. Suppose that the logical qubit is set to the +1 eigenstate of a particular representative $Q \in S(r)^\perp$ of an outer logical operator, right after round $r=0$ mod 3. A different representative may have been chosen here, but since the ISG $S(r)$ contains check operators, whose eigenvalues are random variables even in the absence of any noise, it is necessary to look up the table of measurement outcomes of the check operators to correctly choose a different representative. That is, we must keep track of signs of operators in $S(r)$. This is perhaps unusual in view of conventional stabilizer codes where all stabilizer elements have signs that are fixed once and for all.

Let us move on to measure the type 1 checks at round r+1, which may or may not commute with a chosen representative of the outer logical operator. FIGS. 2A-2D show how the outer operator gets multiplied by an inner operator after one round, using the particular rule of these figures for forming outer operators. Since there are an odd number of rounds, this implies that the outer operator gets multiplied by an inner operator every period. We now derive this separately without making a specific choice of rule with reference to FIGS. 3A-3D.

Indeed, the representative Q(r) shown in FIG. 3A does not commute with some of the type 1 checks, but we can find a different representative $Q(r+1) \in S(r)^\perp$ such that $Q(r+1)$ now commutes with all type 1 checks. FIG. 3B shows a choice of $Q(r+1)$. Repeating the argument for subsequent rounds, we have for all $j \geq 0$ $$Q(r+j+1)=Q(r+j)A_j \in S(r+j)^\perp \cap S(r+j+1)^\perp \quad (1)$$

where $A_j \in S(r+j)$ is a product of type (j mod 3) checks whose sign is determined by $S(r+j)$. $A_0$, $A_1$, $A_2$ are indicated as edges 301-313 in FIGS. 3B-3D.

The two ISGs S(r) and S(r+3) are the same groups up to signs, so it is meaningful to compare Q(r) and Q(r+3) which differ by the product $A_0 A_1 A_2$. It turns out that this product is an inner logical operator.

Our calculation that the product $A_0 A_1 A_2$ is an inner logical operator, is specific to the representative Q(r), and we have made rather arbitrary choices in $A_0$, $A_1$, $A_2$. However, the conclusion that the product $A_0 A_1 A_2$ is a parallel inner logical operator remains true regardless of those arbitrary choices: Every outer logical operator gets multiplied by a parallel inner logical operator every period. To see this, consider another representative Q'(r) of the outer logical operator in the same homology class as Q(r) but widely separated from Q(r). Suppose Q'(r+3) is computed by some arbitrary choices of check operators as above. Since Q'(r+3) has to obey the same commutation relation as Q(r+3) with the static inner logical operators, the difference $Q'(r+3)Q(r+3)^\dagger$ must be either an inner logical operator or a stabilizer. But since the commutation relations must be preserved with the perpendicular outer logical operators, too, the difference $Q'(r+3)Q(r+3)^\dagger$ must be a stabilizer, completing the proof of the claim.

The sign of the product $A_0 A_1 A_2$ depends on the measurement outcomes of the checks. If we keep the honeycomb code state for many rounds, an outer logical operator carries a sign that depends on the checks on the membrane in 2+1-dimensional spacetime that hangs from the present outer logical operator and extends to the past up to initialization step. If we ignore the signs, we conclude that the outer logical operator has period 6 while the measurement sequence has period 3.

We remark that our choice of measurement sequence is important. If, for example, we had instead chosen to measure operators of types x, y, z in rounds r=0, 1, 2 mod 3 respectively, then the inner logical operators would have been in the instantaneous stabilizer group.

1.5 Toric Code Representation and Anyons: Inner Operator is a Fermion

We emphasize that the ISG after any given round $r \geq 3$ is that of a toric code on a hexagonal lattice, up to a local quantum circuit. Each check of type r mod 3 involves two qubits. Informally, we can think of that check as replacing the two qubits by a single qubit. Formally, in either eigenspace (+1 or −1) of that check, a two dimensional subspace remains. We can disentangle this check by applying a local quantum circuit, indeed just a circuit which is a product of gates on the edge, so that the check then acts only on a single qubit, which we ignore for the rest of the subsection so that one qubit per edge remains.

The ISG is generated by those checks as well as the plaquette stabilizers. We will show that plaquette stabilizers are the stabilizers of a toric code on a hexagonal lattice, after this disentangling. A picture makes it clear, see FIG. 4. Assume r=0 mod 3. We have labeled some type 0 plaquettes, but not other types. We have drawn then lines (shown dashed in FIG. 4) across the type 0 edges. After disentangling, there is one qubit per such edge, so there is one qubit for each dashed line. Drawing the dashed lines as they are, we see that each type 0 plaquette stabilizer acts on the six qubits corresponding to dashed lines on the (slightly larger) dashed plaquette surrounding the given plaquette, while each type 1 or 2 plaquette stabilizer acts on the three qubits corresponding to dashed lines terminating at the center of the given plaquette. Indeed, one may verify that the type 0 plaquette stabilizers correspond to plaquette stabilizers of a hexagonal lattice toric code while the type 1 or 2 plaquette stabilizers correspond to vertex stabilizers.

The toric code has three nontrivial anyons, two bosons called e, m, and a fermion called f. The electric operators of the toric code correspond to paths following the dashed edges of FIG. 4, while the magnetic operators correspond to paths on the dual lattice to the dashed lattice. In this representation the outer operator of FIG. 3A is precisely the magnetic operator. Note that on each type r mod 3 edge of FIGS. 3A-3D there is a product of two Pauli operators; this product commutes with the check on that edge, and so acts on the single qubit on that edge after disentangling.

Note also that the inner logical operator is a fermion. This can be seen from the toric code representation. It can also be seen more directly by considering a product of three gauge operators using a "T-exchange" process. Pick four points on the lattice, called a, b, c and 0. Draw three different inner operators: each starts at 0 and they end at a, b, c respectively. Call these three operators $O_a$, $O_b$, $O_c$. These operators are unitaries. We show an example in FIG. 5. The product $O_b^\dagger O_a$ creates an anyon pair at a, b, "moving a particle from a to b. Then the product $O_a^\dagger O_c$ destroys the anyon at a and creates an anyon at c, "moving from c to a". Finally, $O_c^\dagger O_b$ destroys the anyon pair at b, c, "moving from b to c".

This product $O_c^\dagger O_b O_a^\dagger O_c O_b^\dagger O_a$ is equal to −1 as may be seen by a direct computation. All checks in $O_a$, $O_b$, $O_c$ other than the checks which include 0 trivially cancel in this product and the product is equal to (up to an arbitrary relabeling of Pauli operators) XYZXYZ=−1. This shows that the inner operator is a fermion.

Figure 5:
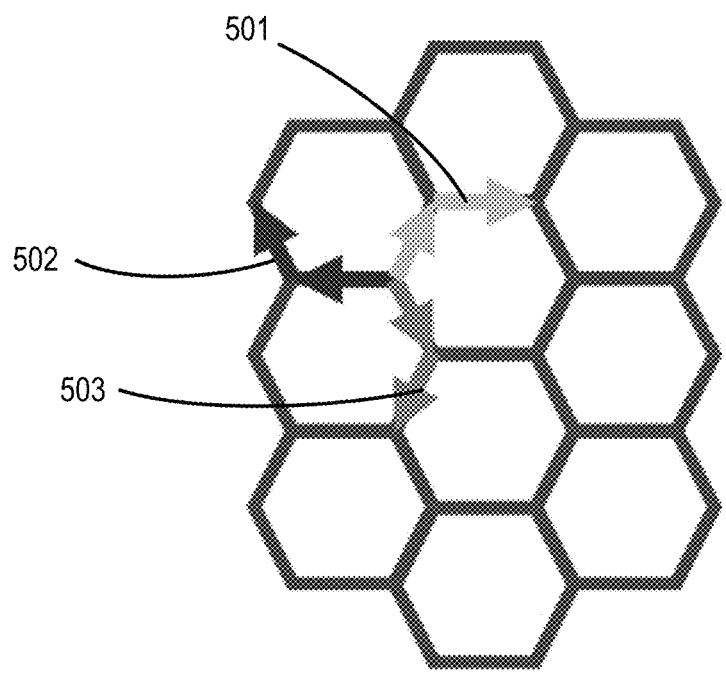
FIG. 5 illustrates representative inner operators.

FIG. 5 shows an example of three inner operators to show that it creates a fermion, draw in three different segments (labeled 501-503) with arrows. The arrows are drawn on the lines to indicate a choice of ordering of operators: each inner operator is a product of checks on the edges, and we choose to order the operators in the direction of the checks. This ordering is not important. The center point is 0, while the other ends of the inner operators at a, b, c Indeed, it should be no surprise that the inner operator is a fermion: the multiplication of the outer operator by a fermion after each round of measurements then means we interchange e↔m. While surprising, at least both particles are bosons. If instead the inner particle were a boson, then we would have interchange boson and fermion after a given round of measurements!

1.6 Majorana Representation

The honeycomb code has a convenient representation in terms of Majorana fermions. The mathematical representation was used in to analyze the Kitaev honeycomb model. The Kitaev honeycomb model and the honeycomb code are related: the honeycomb model has a Hamiltonian which is the sum of checks in the code.

In this Majorana representation, we represent each qubit by four Majorana operators, denoted $\gamma_j^0$, $\gamma_j^X$, $\gamma_j^Y$, $\gamma_j^Z$, where j labels the qubit. Then, the Pauli operators $X_j$, $Y_j$, $Z_j$ are represented by $i\gamma_j^0\gamma_j^X$, $i\gamma_j^0\gamma_j^Y$, $i\gamma_j^0\gamma_j^Z$, respectively. The Majoranas are subject to the requirement $\gamma_j^0\gamma_j^X\gamma_j^Y\gamma_j^Z=1$ for all j; we call this requirement a "gauge constraint".

This representation also describes one possible physical realization of the code, using so-called "tetrons", where each qubit really is represented by four Majorana modes, subject to the gauge constraint due to charging energy. This realization may be particularly suitable for the honeycomb code, since the measurement of the check operators is the "native" operation in that realization (i.e., Clifford gates in that realization are built by measuring products of Paulis, so it is simpler to measure such a product than it is to implement a CNOT gate). Thus, in systems implementing qubits based on Majorana modes, implementation of the disclosed coding approaches is particularly simple.

For each edge (j, k) between a pair of vertices j, k, we define an operator $t_{jk}=\gamma_j^a\gamma_k^a$, where a is X, Y, Z depending on whether the edge is type x, y, z. We may regard these $t_{jk}$ as "gauge fields". The product of $t_{jk}$ around any closed path is equal (up to a scalar) to the product of checks along that path. The operators $t_{jk}$ commute with all checks (when the checks are written in terms of Majoranas), although the $t_{jk}$ do not commute with the gauge constraint.

The physics of the honeycomb code is then clear. Suppose we ignore the gauge constraint. Then, the $t_{jk}$ can be taken as scalars, with their product around any plaquette equal to +1. The other fermions $\gamma_j^0$ are driven by the checks between different states with zero correlation length, i.e., states where after measuring checks of type a for a∈0, 1, 2, the products $i\gamma_j^0\gamma_k^0$ have expectation value ±1 whenever (j, k) is of type a. We can then take this state and impose gauge invariance by projecting onto states obeying the gauge constraint.

The inner logical operators are products of the gauge fields around homologically nontrivial cycles. Each outer logical operator should anticommute with some inner logical operator, while commuting with the plaquette stabilizers, the gauge constraint, and the checks on edges of type r mod 3 after round r.

If it were not for the gauge constraint, such an outer logical operator would be easy to write down: draw any cycle on the dual lattice. Then, take the product over edges (j, k) cut by that cycle of an operator $\gamma_j^a$ where a∈X, Y, Z depending on whether the edge is type x, y, z. Equivalently, one could take operator $\gamma_k^a$ on such an edge. However, this attempt at an outer logical operator may not commute with the gauge constraint and with the checks on edges. To solve this problem, after round r, we may try multiplying the operator by products $\gamma_l^0\gamma_m^0$ for edges (l, m) of type r mod 3. An appropriate choice of such operators to multiply by gives the outer logicals of the last section.

2 Ladder Code

Perhaps the most surprising property of the honeycomb code is that fault tolerance is possible. How can one correct errors, since we can terminate an inner logical operator in such a way that the endpoints commute with all plaquette stabilizers? How can such errors be detected? To better understand how this can work, before giving the proof in the next section, here we will consider a simple ladder model which also has dynamically generated logical qubits.

2.1 Code Definition

Figure 6:
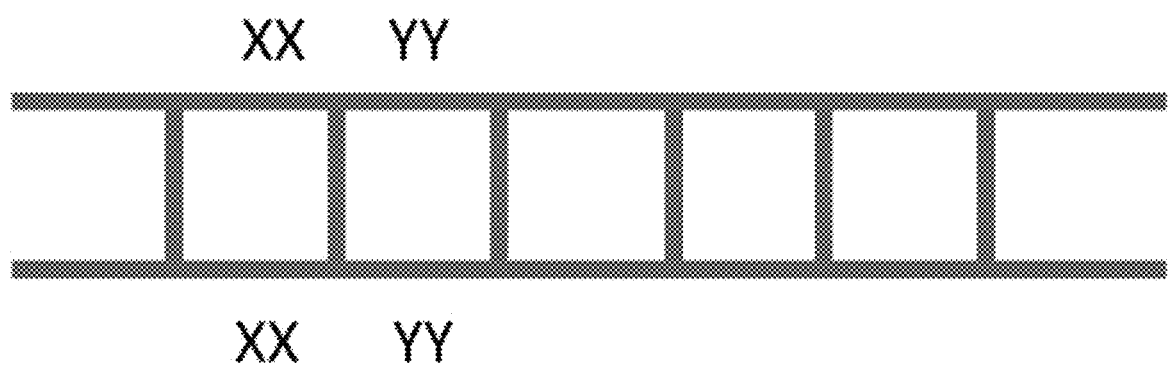
FIG. 6 illustrates a ladder code.

The code is as shown in FIG. 6. There are two legs of a ladder. The ladder is "on its side", so that rungs of the ladder go vertically and legs go horizontally. There is one qubit on each vertex. Vertical checks are all ZZ. Horizontal checks alternate XX and YY on each leg, as shown. An XX check on one leg is directly above an XX check on the other leg, as shown. The ladder is periodic, with an even number of rungs, so that left and right ends are attached.

Instead of using a three round repeating pattern to measure checks, we use a four round pattern. We measure vertical ZZ checks, then horizontal XX checks, then vertical ZZ checks again, then horizontal YY checks, in rounds r=0, 1, 2, 3 mod 4, respectively. The reason for using this four round repeating pattern is that if we instead had a three round repeating pattern (such as ZZ checks, then XX checks, then YY checks, on two successive rounds we would measure all XX cheeks, then all YY checks, and so we would measure an inner logical operator, i.e. we would measure the product of all horizontal checks on a single leg of the ladder.

The ISG is easy to describe for r≥4. The ISG is generated by the plaquette stabilizers, which are products of checks around a square of the ladder, and also the most recently measured checks.

A representative of the inner logical operator is the product of checks on a leg of the ladder. e.g., the product of Pauli Z over the bottom leg. An outer logical operator which anticommutes with this inner logical operator is the product XX on any given vertical rung after r=1 mod 4 and the product YY after r=3 mod 4. After r=0, 2 mod 4, we may take either the product XX or the product YY on a rung as the outer logical operator: they differ by the product ZZ which is the check that was just measured on that rung.

FIG. 6 shows a ladder code having one qubit per vertex. Checks on vertical legs are ZZ on the two qubits. Checks on horizontal legs are alternately XX or YY; some of the horizontal checks are shown.

2.2 Fault Tolerance

The input for a decoder consists of certain linear combinations of measurement outcomes of the checks, called "syndrome" bits. They are designed to assume a trivial value deterministically in the absence of any faults and to provide sufficient information to infer likely faults. Our syndrome bits are simply the plaquette stabilizers' eigenvalues, but recorded every time they can be inferred from recent measurement outcomes. Since the plaquette stabilizers are always present in the ISG at any moment, we know that they must assume +1 in the absence of any noise.

Concretely, suppose we have just finished YY measurement in round −1 mod 4. In the next round, r=0 mod 4, we measure ZZ. The product of outcomes of YY from the previous round and those of ZZ from the current round, gives the eigenvalues of the plaquettes that straddle YY links. Next (r=1 mod 4), we measure XX whose outcomes are combined with those of ZZ to give the eigenvalues of the plaquettes that straddle XX links. Next (r=2 mod 4), we measure ZZ whose outcomes are combined with those of XX to give the eigenvalues of the same set of plaquettes. That is, we record the eigenvalues of the plaquettes over XX links, twice in a row. Next (r=3 mod 4), we measure YY whose outcomes are combined with those of ZZ to give the eigenvalues of the plaquettes over YY links. Thus, we have completed one period of our measurement sequence, and we have recorded the eigenvalues of all plaquettes, twice for each. They are our syndrome bits.

Now we examine how we can use the syndrome bits. A single-qubit Pauli error at any point will flip two of the checks, so (the eigenvalue of) at least one plaquette will be flipped. This is no different from a usual situation with stabilizer codes where a single-qubit. Pauli error anticommutes with some stabilizer. Such a violation of a plaquette stabilizer persists indefinitely. Since the instantaneous stabilizer code of the ladder code has code distance 2, we conclude that the ladder code is error detecting with effective distance 2.

More interestingly, inasmuch as the classical repetition code of quantum distance 1 can correct many classical bit flip errors, the ladder code can correct certain type of errors. Consider a chain of "check errors," each of which is by definition a unitary operator equal to some check operator. The chain of all check errors along the bottom leg of the ladder is an inner logical operator, and we wish to correct any chain of check errors of sufficiently small weight. For simplicity, we only consider XX and YY check errors on the bottom leg. Suppose an XX check error occurs right after the YY measurement round. The next round is to measure ZZ, two of which will be flipped by the error, which in turn flips two plaquettes (two syndrome bits) over YY links. After ZZ are measured, the next is to measure XX, into which the error is absorbed. After one period of the measurement sequence, the net effect of the XX check error is to flip two syndrome bits, which exist only in one time slice. Unlike a single-qubit Pauli error, this check error is short-lived. If we have a chain of consecutive check errors right after the round of YY measurement at round, say, −1, then exactly two plaquette stabilizers over YY links, which are inferred after round 0, are flipped, and they are at the ends of the error chain.

Above, we have inserted check errors only at a particular time slice, but a similar argument applies for any time slice. Hence, in a low error rate regime, if we knew that errors are check errors only, we can correct errors confidently by a minimum-weight matching of nontrivial syndrome bits. Note that although check errors do commute with plaquette stabilizer operators, we can detect check errors because we measure plaquette operators by two rounds of measurements, one of which anticommutes with the error.

If measurement outcomes can be incorrectly recorded (measurement error), we have to consider an array of syndrome bits in 1+1-dimensional spacetime. Let us consider faults in the ZZ measurement outcomes. One rung with a ZZ check is used in two neighboring syndrome bits which have distinct time coordinates. So, if that ZZ measurement outcome was incorrect, then we would read the two syndrome bits flipped. If our error model only allows ZZ measurement outcome faults and check errors along the bottom leg of the ladder, then any fault pattern gives a $\mathbb{Z}_2$-chain whose end points ($\mathbb{Z}_2$-boundary) are nontrivial syndrome bits. Note that a ZZ measurement error near the end point of a long check error chain does not change the fact that there is an odd number of nontrivial syndrome bits near the end of the chain. Again, at low noise a matching algorithm or other decoder for the two dimensional toric code will decode the errors correctly. We can imagine two different scenarios to understand fault tolerance. In the simplest, check errors exist for a certain number of rounds, and then later the noise is turned off. In this case, if decoder finds a matching in the correct homology class, then no logical error occurs. In the other scenario, we imagine errors occurring all rounds, and then one wishes to read out the outer logical operator at some given round $r_0$. In this case, the decoder will match errors at early rounds, but a low density of errors near round $r_0$ may remain. However, since the outer logical operator can be read at out at L different positions, where L is the length of the chain. By a majority decoding of the L different outcomes, we can still decode in this setting.

3 Error Correction for Honeycomb Code on Torus

The group of all plaquette stabilizers is a static subgroup of the instantaneous stabilizer groups for all time steps $r \geq 3$. Hence, it is natural to record all the eigenvalues of the plaquette stabilizers. We declare that these are our syndrome bits. They are always trivial ($0 \in \mathbb{F}_2$) in the absence of any faults. In each round, we obtain a fresh subset of syndrome bits associated with exactly one-third of all plaquettes. We show in this section that these syndrome bits are sufficient for fault tolerance.

3.1 Perfect Measurement Outcomes

Figure 7:
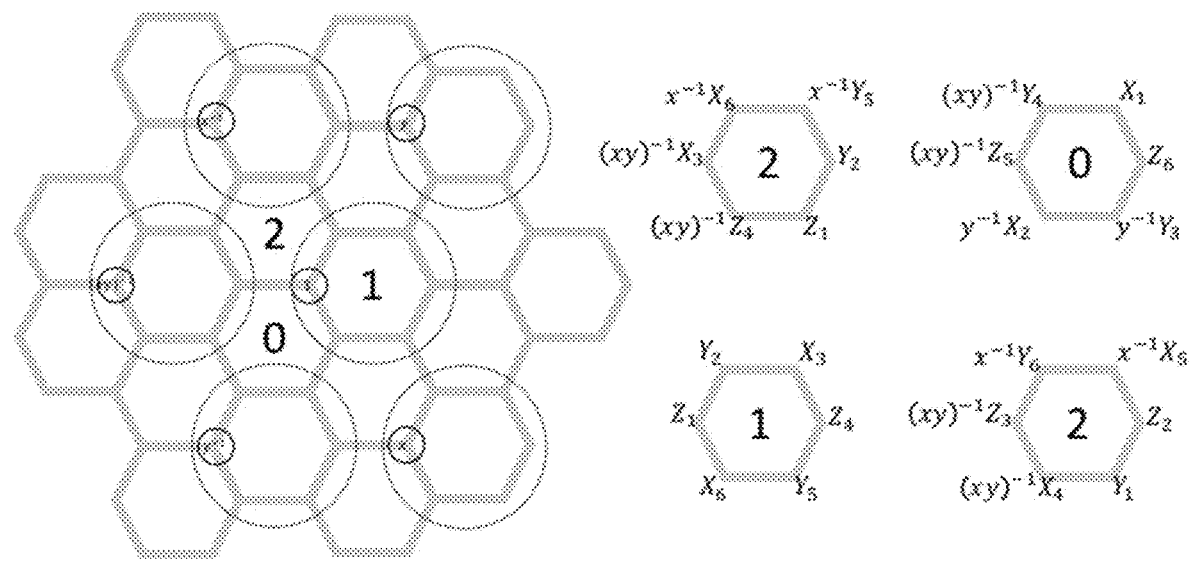
FIG. 7 illustrates a coordinate system and unit cell of the honeycomb code. This is used to write $\epsilon_R$, the matrix that maps a Pauli error to syndrome bits. Each large circle on the left is a unit cell containing 6 qubits. The position of a unit cell is denoted by a monomial in translation variables x, y. On the right, the upper left plaquette denotes the "half" operator of a type 2 plaquette stabilizer. The remaining three plaquettes denote the full plaquette stabilizers.

We first consider the simpler case where all measurement outcomes are reliable. (This amounts to the noiseless syndrome measurements in usual stabilizer codes.) Suppose that we just have completed a round $r_0=0$ mod 3, until which there is no error, and then some errors are inserted. After the errors, we have round $r_0+1$ to measure the type 1 checks. The outcomes at round $r_0+1$ are combined with those at round $r_0$, to give the eigenvalues of type 2 plaquettes. Due to errors inserted between rounds $r_0$ and $r_0+1$, some of these eigenvalues may be nontrivial. Even if the error commutes with a type 2 plaquette stabilizer P, the syndrome bit on P can be nontrivial since the eigenvalue of P is measured in two rounds between which errors are inserted; the relevant, operator here is the product of three type 1 checks ("half stabilizer") around a given type 2 plaquette; a type 2 plaquette stabilizer is the product of six checks. See FIG. 7.

For the three subsequent rounds ($r_0+2, 3, 4$), we obtain syndrome bits over all plaquettes, determined by the commutation relation between the error and the (full rather than half) plaquette stabilizers. Note that we have two bits of syndrome for each plaquette of type 2, but one bit for each plaquette of type 0 and 1. This is necessary to catch certain non-check weight 2 errors; they are on the edge shared between a type 0 plaquette and a type 1 plaquette, which commutes with all type 0 and 1 plaquette stabilizers and also with the half stabilizers on type 2 plaquettes.

As in the toric code, not all errors are harmful (i.e., the code is degenerate). Obviously, any plaquette stabilizer does not cause any nontrivial syndrome bit since it commutes with any check operator. In addition, every type 0 check operator belongs to the instantaneous stabilizer group after round $r_0$, so it does not flip any syndrome bit since it commutes with all the half plaquette operators. Lastly, any error that is equal to a type 1 check operator is simply absorbed to the measurement at round $r_0$, +1, and does not change any measurement outcome. Not only do these errors leave zero syndrome, but also they have no effect on the outer logical operator's sign; they are inconsequential. Lemma 3.1. Let $r_0 \geq 3$. On the infinite plane, let E be any finitely supported error inserted between rounds $r_0$ and $r_0$, +1. if E leaves trivial syndrome bits, then E is a product of finitely many type ($r_0$+1 mod 3) checks and a finitely supported operator of the instantaneous stabilizer group after round $r_0$.

That is, if the syndrome bits are trivial, E is inconsequential. The proof of this lemma will appear at the end of this section.

Equipped with the lemma, we consider the honeycomb code on a torus of linear size L, a multiple of 3, with errors inserted between rounds $r_0$ and $r_0+1$. The honeycomb lattice has two qubits per Bravais lattice point, so there are $2L^2$ physical qubits in the system. There are $L^2$ plaquettes (hexagons). There is an outer logical operator of weight 4L/3, and there is an inner logical operator of weight 2L.

A direct consequence of the lemma is that any nontrivial logical operator between rounds $r_0$ and $r_0+1$ must not be contained in a rectangle whose linear size is less than L. If it did, we can think of an infinite lattice on which the hypothetical logical operator O is laid (lifting) such that the lifted operator gives zero syndrome. By Lemma 3.1, the operator O would be a product of inconsequential operators that have no effect on the logical operators at later rounds. Therefore, the code distance of the honeycomb code on a torus is proportional to the linear size of the torus.

The lemma also implies that there is a nonzero error correction threshold $p_{th}>0$: if each qubit between rounds $r_0$ and $r_0+1$ suffers from an independent Pauli error with probability $p<p_{th}$, then we can identify the error up to inconsequential ones, with failure probability that is exponentially small in the code distance. This is almost a direct consequence of a universal threshold theorem. Instead of repeating the proof with some amendment, which will give too small a threshold estimate in view of practical interests, let us here explain intuitively why there is a positive error correction threshold.

Imagine that there is some cluster of nontrivial syndrome bits, that, we call "charges," caused by an error E supported on a rectangle that covers all the charges. Assume that the covering rectangle has linear size less than L. We do not know the error operator, but we do know a covering rectangle from the location of the charges. The decoder's task is to find the error up to inconsequential ones (which are simply stabilizers in usual stabilizer codes). The situation is expressed as a linear equation as follows. We have $2L^2$ qubits, on which every Pauli operators corresponds to a binary vector of dimension $4L^2$, and $4/3L^2$ syndrome bits. (Recall that there are two bits per plaquette of type 2 but only one per that of type 0 and 1.) The association from Pauli operators to the syndrome bits is $\mathbb{F}_2$-linear:

$$\epsilon \mathbb{F}_2 \colon \mathbb{F}_2^{4L^2} \to \mathbb{F}_2^{4L^2/3} \qquad (2)$$

The charges define a vector e in the image of this map, and we have to find a vector p in the domain such that $\epsilon \mathbb{F}_2(p)=e$ with the geometric constraint that p must be contained in the covering rectangle. This is a simple linear algebra problem with a matrix obtained by truncating $\epsilon \mathbb{F}_2$. Any solution to this linear equation (on the truncated matrix) gives a Pauli operator C such that the Pauli operator EC gives zero syndrome. The operator EC is contained in the covering rectangle, and the lemma says that EC must be inconsequential.

In general, an observed geometric pattern of charges will not be covered by such a (small) rectangle. However, in the large system size with small enough error probability on each qubit, it is exponentially unlikely in the system size that the error pattern is dense and extended. With high probability, errors form small clusters and there are large voids without any error. The charges must be near the errors, and if we group the charges according to their pairwise distances, we can find each component of errors and hence identify proper covering rectangles. If we apply the procedure above to each covering rectangle, and find correcting operator in each cluster, the decoding succeeds with high probability. One needs to specify how the clusters are identified by the spatial distribution of charges, but the RG strategy can be used without any change.

We have to remark that to quote the proof, a rather technical condition is needed. The argument there assumes that for any error E that can be covered by a rectangle of linear size less than L, there be an operator E' within O(1)-neighborhood of a rectangle that covers $\epsilon_{\mathbb{F}_2}$ (E) such that $\epsilon_{\mathbb{F}_2}$ (EE') is zero. The subtlety here is that the rectangle that covers $\epsilon_{\mathbb{F}_2}$ (E) may be much smaller than the one that covers E. This is a property on the matrix $\epsilon_{\mathbb{F}_2}$ that one needs. Fortunately, we can use the polynomial module membership test based on Gröbner bases to guarantee this property. The argument is briefly as follows. Using the spatial periodicity of the honeycomb code, we can compactly represent $\epsilon_{\mathbb{F}_2}$ by a 4-by-12 matrix $\epsilon_R$ with entries in polynomial ring $R = \mathbb{F}_2[x^\pm, y^\pm]$. The matrix $\epsilon_R$ has no reference to the system size L. The number of rows is 4 because there are four syndrome bits per unit cell, and the number of columns is 12 because there are six qubits per unit cell. The technical requirement is essentially a property on the infinite plane, which transcribes to the statement that for any element $\epsilon$ in the image of $\epsilon_R$ there is a Laurent polynomial vector p such that $\epsilon = \epsilon_R(p)$ and that the maximum $l_1$-norm of the exponents (e.g., $x^3 y^{-2} \to 5$) of p do not exceed that of e plus some constant independent of e. This transcribed statement has an algorithmic proof: reduce e using a Gröbner basis of the columns of $\epsilon_R$.

Proof of Lemma 3.1. As discussed above, the map from Pauli errors to syndrome can be expressed as a 4-by-12 matrix $\epsilon_R$. Using the coordinate system in FIG. 7, the matrix $\epsilon_R$ is found to be the following.

$$\epsilon_R = \begin{pmatrix} 1 & 1 & 0 & xy & x & 0 & 0 & 1 & xy & 0 & x & x \\ 0 & 0 & y & xy & xy & 1 & 1 & y & y & xy & 0 & 0 \\ 1 & 1 & 0 & 1 & 1 & 0 & 0 & 1 & 1 & 0 & 1 & 1 \\ 1 & 1 & xy & 0 & 0 & x & 1 & 0 & 0 & xy & x & x \end{pmatrix} \quad (3)$$

The inconsequential Pauli operators in the claim form a (nonabelian) group which can be cast into a polynomial matrix as well:

$$\sigma = \begin{pmatrix} xy & 0 & xy & xy & 0 & 0 & 0 & 0 & 0 \\ x & xy & 0 & xy & 0 & 0 & 0 & x & 0 \\ x & xy & 0 & 0 & xy & 0 & x & 0 & 0 \\ 1 & 0 & 1 & 0 & xy & 0 & 0 & 0 & 0 \\ 0 & xy & y & 0 & 0 & 0 & 0 & 1 & 0 \\ 0 & xy & y & 0 & 0 & 0 & xy & 0 & 0 \\ 0 & xy & xy & 0 & 0 & 0 & 0 & 0 & xy \\ 0 & xy & xy & 0 & 0 & 0 & 0 & x & 0 \\ x & 0 & 1 & 0 & xy & 0 & 0 & 0 & 0 \\ 1 & xy & 0 & 0 & xy & 0 & 0 & 0 & 1 \\ 1 & xy & 0 & 0 & 0 & xy & 0 & 1 & 0 \\ xy & 0 & y & 0 & 0 & xy & 0 & 0 & 0 \end{pmatrix} \quad (4)$$

There are 3 plaquettes, 3 check operators of type 0, and 3 check operators of type 1 in each unit cell. Hence, there are 9 columns in $\sigma$. It is straightforward to check that $\epsilon_R \sigma = 0$ over R. By the Buchsbaum-Eisenbud criterion for finite exact sequences, it suffices to compute the detrimental ideals of $\epsilon_R$ and $\sigma$. A direct calculation shows that $I_4 (\epsilon_R) = (x^2+1, y^2+1, (1+x)(1+y)) = I_8 (\sigma)$ that has depth 2, and $I_9 (\sigma) = 0$. Hence, the rank condition 4+8=12 is met, and the depth condition ($\geq 2$) is met. This means that the kernel of $\epsilon_R$ is equal to the image of $\sigma$. Any finitely supported error E corresponds to a vector in the domain of ER, which is the codomain of $\sigma$. For E to be in the kernel of $\epsilon_R$ means that it causes zero syndrome. For E to be in the image of $\sigma$ means that it is a product of inconsequential errors. □

3.2 Imperfect Measurement Outcomes

With potentially incorrect measurement outcomes, we have to repeat the rounds. Here we impose an open boundary condition in time, and consider the indefinitely long history of measurements. The syndrome bits are as before: we record all the eigenvalues of plaquette stabilizers, inferred by the check outcomes from most recent two rounds. (All measurement outcomes are recorded to correctly infer the outer logical operator including the sign, but in order to identify errors we only use the syndrome bits.) For each period (3 rounds) we obtain a fresh set of syndrome bits over all plaquettes.

Without loss of generality, we may assume that Pauli errors on qubits occur between rounds $r_0$ and $r_0+1$ where $r_0$ is any multiple of 3. There may be Pauli errors between $r_0+1$ and $r_0+2$ or between $r_0+2$ and $r_0+3$, but they can be commuted through the checks at the expense of introducing fictitious errors on measurement outcomes.

As in the usual toric code decoding in the presence of measurement errors, the relevant data for a decoder is a bipartite graph of syndrome bit changes. A left node of this graph is a spacetime location where a plaquette stabilizer changes; the time coordinate of the left node is not when the plaquette stabilizer is inferred, but rather the mid-point in between two such inferences. A right node of the bipartite graph corresponds to an X or Z operator or a check at a particular spacetime location. A Pauli error causes at most one change for a plaquette stabilizer. In contrast, a measurement error on a check causes flips on exactly 2 plaquette stabilizers, which corresponds to 4 changes in spacetime.

There are four classes of faults that are inconsequential:
1. The inconsequential Pauli errors that we have studied in the perfect measurement case above, remain inconsequential in the current, imperfect measurement case.
2. Check operator errors are short-lived and equivalent to some measurement errors.
3. A Pauli error at a time step and exactly the same Pauli error at a later time step will cancel each other, and if combined with some measurement errors, it will go undetected and inconsequential.
4. A set of 4 measurement errors within a period on 4 distinct checks that meet a common check C is equivalent to measurement outcome flips caused by the check operator on C that belongs to an instantaneous stabilizer group, and hence is inconsequential.

We have confirmed that these inconsequential errors generate all other inconsequential errors:

Lemma 3.2. In the 2+1-dimensional spacetime that is infinite in any direction, if finitely many faults cause no syndrome change, then the total fault is a finite combination of the inconsequential faults listed above.

Proof. Note that there are redundancies in our enumeration of inconsequential faults. There are 6 qubits and 9 edges per unit cell of the labeled honeycomb lattice. Hence, per spacetime unit cell, there are 6·2+9=21 elementary faults and 3 syndrome change nodes. This means that the matrix $\epsilon_{2+1}$ analogous to $\epsilon_R$ in the proof of Lemma 3.1 is now 3-by-21. In our list of elementary inconsequential faults, per spacetime unit cell, there are, first, 9 "space-like" Pauli faults, second, 3 check operator errors combined with measurement faults, third, 12 pairs of time-separated Pauli errors combined with measurement faults, and fourth, 9 quadruple measurement faults on edges that surrounds an edge. These total 33 faults per unit cell. So, the matrix $\sigma_{2+1}$ analogous to a in the proof of Lemma 3.1 is now 21-by-33. We have checked the Buchsbaum-Eisenbud criterion to confirm that the sequence $$R^{33} \xrightarrow{\sigma_{2+1}} R^{21} \xrightarrow{\epsilon_{2+1}} R^3 \tag{5}$$

is exact at the middle module. Here, $R = \mathbb{F}_2[x^{\pm}, y^{\pm}, t^{\pm}]$. □

This shows by a similar argument as in the previous subsection that there is a positive volume in the parameter space of error rates for Pauli errors and measurement errors in which the probability that a decoder fails to correctly identify errors up to inconsequential ones is exponentially small in the linear system size.

4 Decoding from the Matching Perspective

In this section, we give an alternative approach to decoding the honeycomb code, showing that it can be done using a matching algorithm. We work in a simplified error model, with perfect measurement of check operators and Pauli errors occurring randomly and independently on qubits in between the measurement of check operators. Note that a threshold in this simplified error model implies a threshold even with imperfect measurement of check operators, as a single measurement error is equivalent to a pair of qubit errors. Consider measuring for example some XX check. If an error of type Y or Z occurs on one of the qubits before measurement, and the same error occurs immediately after measurement, then the effect is same as that of an imperfect measurement. In practice, however, since independent measurement errors then are equivalent to correlated qubit errors, a better threshold may be achieved by an algorithm that takes this into account; we do not consider optimizing the decoding algorithm here.

We now modify the error model. Consider some Pauli error on a qubit. Immediately before the error, we measure a check supported on that qubit, involving some Pauli operator $P_1 \in \{X, Y, Z\}$ on that qubit. Immediately after, we measure some other check supported on that qubit, involving some other Pauli operator $P_2$ on that qubit. We use these two Pauli operators as a basis for Pauli errors. For example, if immediately before we measured an XX check and immediately after we measured a YY check, we expand errors on that qubit in the basis X, Y. We use an error model where errors of types $P_1$, $P_2$ occur independently so that an error of type $P_1 P_2$ can then occur as a combination of two errors; of course, in practice, if the actual error model has all three error types $P_1$, $P_2$, $P_1 P_2$ equally likely, a better threshold may be achieved by an algorithm that takes this into account.

There is some stabilizer involving these two checks (the one immediately before and the one immediately after the error), and either a $P_1$ or a $P_2$ error will flip the value of this stabilizer. However, a $P_1$ error will flip the inferred value of the stabilizer from those checks, while a $P_2$ will not. In the example above, an X error will flip the stabilizer and will flip the value of the subsequent. YY check so that the inferred value of the stabilizer changes, while a Y error will flip the stabilizer but will not flip the subsequent check, so the inferred value does not change. However, the $P_2$ error can be commuted through the subsequent check; in this case, the Y error can be commuted through the YY check. Commuting through in this way does not change the state or spacetime history of measurement outcomes. So, we will do this commutation of any $P_2$ error.

This leaves a restricted error model: Pauli errors may occur on a qubit of a type corresponding to whatever check was measured previously: if an XX, YY, ZZ check is measured, then subsequently a Pauli error may occur of type X, Y, Z respectively, with errors occurring independently. Since there are 6=9·⅔ qubits per unit cell (each of 9 types of checks has 2 qubits, each of which is shared by 3 checks), the number of independent elementary faults per unit spacetime volume in this simplified error model is only 18.

Any Pauli error will flip the value of exactly two stabilizers. Thus, treating faults as being the change in the inferred value of a stabilizer, a matching algorithm can then match faults. A Peierls argument shows that there is a positive threshold so that up to this threshold a minimum weight matching algorithm will match errors leaving all "loops" of errors small. Since we have shown in the previous section that any small error with zero syndrome change is always inconsequential, the matching decoding algorithm has a positive threshold. Alternatively, the matching construction here can be used to show that any loop is inconsequential. After measuring checks of type r, we infer stabilizers of type r+1 mod 3. A Pauli error after that measurement will flip one plaquette stabilizer of type r+1 mod 3 and one of type r+2 mod 3. Consider any given loop, and consider the first round of errors in the loop. Without loss of generality, suppose that those errors are flipping plaquette stabilizers of type 0 and 1. Since we will immediately after measure checks of type 0 and so infer stabilizers of type 1, every plaquette of type 1 must have an even number of Pauli errors flipping it. We can move these errors by multiplying them by check operators of type 2 so that errors are paired up, both errors in a pair on some edge of type 0. Since they are paired, we can commute them through the subsequent measurement of that type 0 check, and then re-expand them in the appropriate Pauli basis and again move forward in time. Continuing to push errors forward in time in this way, we can reduce to the case that all errors in the loop occur in only two rounds, at which point one may show that the errors in each of those rounds individually give an element of the ISG and hence are inconsequential. This is a pictorial way to see how the polynomial division algorithm with Groebner basis works, a "broom" algorithm as the errors are swept forward.

This matching argument has an interesting relation to the fact that the outer operators Q(r), U(r+1) of FIGS. 2B-2D differ by an inner operator. Equivalently, an inner operator equals the product of two outer operators Q(r), U(r+1) at different rounds. The reader may verify that if we take a partial implementation of that inner operator at some round, write it as a product of Paulis, and then use the rule above to commute certain Paulis to a subsequent round, the result indeed is two outer operators at different rounds. Further, this should be unsurprising by considering a partially implemented inner operator with two endpoints. At either endpoint, the inner operator causes the inferred stabilizer to flip twice, i.e., there are two faults. However, a partial implementation of the outer operator Q(r) causes a single flip in the inferred stabilizer. So, two partially implemented operators Q(r). U(r+1) produce the same faults.

5 Boundary Conditions

It may be desirable to have a code which can be realized with a planar geometry, rather than a torus. In this case, we need to be able to introduce boundary conditions. Before considering how to introduce boundary conditions using a sequence of measurements of pairwise operators, let us first consider how to modify the bulk ISG near a boundary to introduce boundary conditions.

Figure 8:
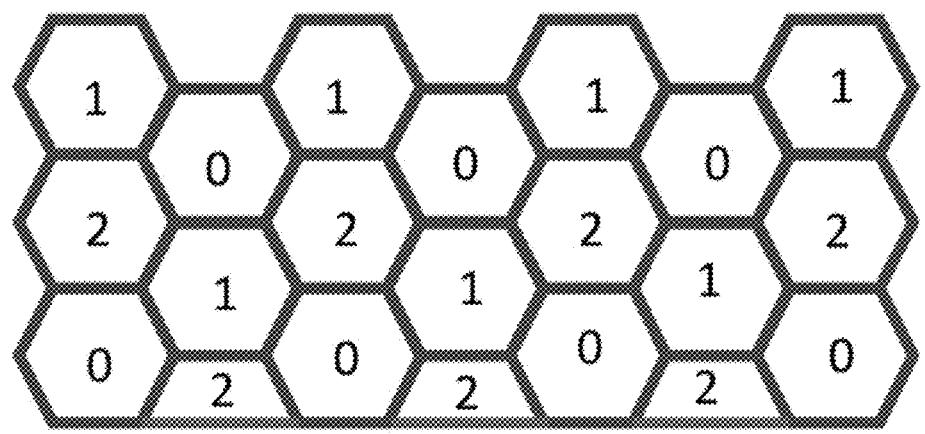
FIG. 8 illustrates an instantaneous stabilizer group (ISG) having boundary conditions.

Consider FIG. 8. We will only consider introducing a boundary at the bottom of the figure. The left and right edge will be extended as desired and then joined with periodic boundary conditions, giving an annulus. Another boundary will be added at the top, possibly first extending the figure upwards, of course. One may call this kind of boundary an "armchair" boundary, similar to the use of the term in carbon nanotubes.

We have added some additional edges to the bottom of the figure so that all vertices are trivalent. This creates also some square plaquettes. These added edges are type 0 and the added plaquettes are type 2: the type of an edge depends on the plaquettes at its ends, regardless of whether those plaquettes are squares or hexagons.

The checks corresponding to these added edges will also be pairwise, being a product of two Pauli operators. The particular Pauli operators chosen for these checks will be such that for every qubit, the three checks incident involve distinct Pauli operators on that qubit. Indeed, for all figures that follow, we assume that the Pauli operators are chosen in this way.

Suppose we take the ISG defined above for the honeycomb code after any given round r≥3, restricting to just the terms in the ISG which are supported on the lattice with boundary. Then add the following additional stabilizer generators. For every square plaquette, add the product of checks around that plaquette as a plaquette operator. Also, if r=2 mod 3, add the checks supported on the added type 2 edges. Call the resulting ground the "boundary ISG".

One may verify that these added generators give a gapped boundary. The boundary conditions are a so-called "smooth" boundary for r=1 mod 3 and a so-called "rough" boundary for r=2 mod 3. These different smooth and rough boundary conditions correspond to what are also called electric and magnetic boundary conditions.

We can immediately guess then that if we start with the boundary ISG after round r and then measure checks of type r+1, there is no problem if r=0, 1 mod 3, but that there will be a problem if r=2 mod 3. The reason is, going from r=0 mod 3 to r=1 mod 3 or r=1 mod 3 to r=2 mod 3 interchanges electric and magnetic (or smooth and rough) boundary conditions, which matches what we expect since the outer logical operator changes from an electric to a magnetic string and vice-versa after each measurement round. However, going from r=2 mod 3 to r=0 mod 3 leaves the boundary conditions of the same type.

We can see that there is a problem for r=2 mod 3 in a different way also: measuring all type 2 checks and then all type 0 checks will measure the inner logical operator which is the product of all checks on the bottom boundary, i.e., this is the product of checks on the bottom of the squares times those on the bottom of the type 0 hexagons at the bottom of FIG. 8.

One simple remedy is as follows. Consider a system on an annulus of length L. Start with an ISG after measuring type 0 checks. Pick a strip of size O(1) extending from top to bottom boundary. In this strip measure checks 0, 1, 2, 0 in sequence. This allows one to measure all of the plaquette stabilizers (since every plaquette of type r+1 mod 3 can be measured by measuring checks r, r−1 mod 3 successively). It does not however lead to a measurement of the inner logical operator on the boundary since the strip does not extend the full length of the boundary. In fact, we may do this on of order L nonoverlapping strips in parallel. Then, choose another set of order L nonoverlapping strips, and do the same sequence, repeating until all plaquettes are measured.

One may wonder: is it possible to retain the periodic sequence of measuring 0, 1, 2 checks cyclically in the bulk? For example, could some clever choice of pairwise checks on the boundary (perhaps measuring the checks with period 6 or higher near the boundary) be found to avoid leaking information? In fact there is a topological obstruction to doing this using only pairwise checks, at least in a certain sense that we explain below.

We use the Majorana language throughout. Our goal is to analyze the system on an annulus. Consider some arbitrary trivalent graph, with qubits on the vertices. Give the vertices two coordinates x, y in the plane, with the system periodic in the x direction with period L. However, to introduce some ideas we consider the system where the x coordinate is not periodic; instead we consider an infinite system in the x direction. In this case, we can introduce a topological invariant. We suppose from here on (this is one of the assumptions) that after any number of measurements (perhaps after some but not all checks have been measured in a round) suppose that the ISG includes plaquette stabilizers guaranteeing (in the Majorana language) that the product of gauge fields around any homologically trivial loop is +1. Further, assume that the ISG is generated by these plaquette stabilizers as well as by $\gamma_j^o \gamma_k^o$ times a product of gauge fields on a path from j to k. Note that a pairwise check is such a $\gamma_j^o \gamma_k^o$ times such a product of gauge fields when j, k are neighbors.

In this case, we can easily see how the ISG changes when checks are measured. Indeed, with open boundary conditions, since the system is topologically trivial, there is no need to specify the path; with periodic boundary conditions, we need to specify the homology class of the path. So, we can represent the ISG by drawing a set of "dimers". Each generator $\gamma_j^o \gamma_k^o$ (times the product of gauge fields) is represented by a "dimer", which simply means an unordered set of two elements {j, k}. The dimer can be represented pictorially by drawing a line from j to k (with the line not necessarily on the edges of the graph). Further, every site will be in exactly one dimer so that the ISG has the correct number of generators.

Then, the effect of measuring a check on a pair k, l is as follows: if there are dimers {i, k} and {j, l}, then after measuring the check we have dimers {i, j} and {k, l}. The reader may then see what happens when measuring on a hexagon. Label the sites 1, 2, 3, 4, 5, 6. Start with an ISG where 3 edges of a hexagon contain dimers, say {1, 2}, {3, 4}, {5, 6} and then measure checks on the other three edges. The dimers change to {1, 4}, {2, 3}, {5, 6}, then {1, 6}, {2, 3}, {4, 5} as we measure checks on edges 2, 3 and 4, 5 in turn. One may pictorially think of this as one of the dimers (in this case, the {1, 2} dimer) splitting in two, with one of the two haves "winding around" the hexagon before rejoining its partner. The final measurement of check 5, 6 then measures the product of gauge fields around the hexagon.

This dynamics for dimers has an invariant: the number of dimers connecting sites with x coordinate >0 to those with x coordinate <0 is invariant modulo 2. Indeed, 0 can be replaced by any number here. We can see this pictorially as counting the number of dimer lines which are cut by a line drawn at 0.

Remark: in fact, our graph has a two sublattice structure (i.e., there is a perfect cut, into two sets A, B), because we wish all plaquettes to have even length. Using this structure, we can promote this $\mathbb{Z}_2$ invariant into an integer invariant by ordering the sites in the dimer from A to B, and counting the number with a sign depending on whether site A is <0 and site B is >0 or vice-versa. However, we will not need to consider this in what follows.

Now we consider the case of an annulus. In this case, everything is the same, except that we need to specify the homology class of the path from j to k for each dimer {j, k}.

Then, the effect of measuring a check on a pair k, l is as follows connected by some path $P_{k,l}$: if there are dimers {i, k} and {j, l} connected by paths $P_{i,k}$ and $P_{j,l}$, then after measuring the check we have one dimer {i, j} connected by a path $P_{i,k}+P_{j,l}+P_{k,l}$ and another dimer {k, l} connected by a path $P_{k,l}$. Here, the sum of paths means their sum of $\mathbb{Z}_2$ chains. Specifying the homology class of the path allows us to continue to define this invariant for a periodic system. Count, modulo 2, the sum over dimers of the number of times the path for that dimer cross some fixed line from one edge of the annulus to the other. That is, treat the sum of paths as a chain and compute its $\mathbb{Z}_2$ intersection with some chain.

Remark: this kind of invariant for periodic systems is long-studied in the condensed matter physics literature, but typically rather than explicitly specifying the path, one considers dimers whose endpoints are nearby and then one implicitly uses a shortest path.

Now, suppose one has found some clever sequence of checks at the boundaries so that the inner logical operator of the code is not measured. Consider an annulus, measuring cyclically 0, 1, 2 in the bulk, and use this "clever sequence" at the top boundary but continue to use a "naive sequence" at the bottom boundary, where the naive sequence is simply to use the armchair boundary conditions and measure checks 0, 1, 2 cyclically at the bottom boundary also.

Start with an ISG after round 0 where are all dimers are nearest neighbors on the graph, and all paths are shortest paths. Then measure checks 1, 2, 0 in sequence. Then, in the bulk, the dimers return to their initial state. However, at the bottom (naive) boundary, one finds that the sum of paths has changed by adding a nontrivial homology representative. (Of course, one has also changed the ISG by adding the inner logical operator to the ISG too).

Hence, no matter what sequence is chosen at the top boundary, the sum of paths must also add a nontrivial homology representative. Heuristically, one may say that an odd number of Majoranas have "wound around" the annulus at the bottom edge, and so the same must happen at the top edge. Then, the measurement of checks reveals the inner logical operator also at the top boundary!

This topological obstruction does not, however, prevent transitions which are cyclic in the bulk but which use more complicated, non-pairwise checks on the boundary (which in turns can be built out of pairwise checks with ancillas). For example, one can follow a sequence 0, 1, 2, finishing at 2 with rough boundary conditions. Then, before measuring 0, one can shrink the code by single qubit measurements near the boundary so that 0 becomes smooth, and then measure 0. One may continue in this fashion, shrinking as necessary, and then uses non-pairwise checks to grow the code to compensate the shrinking.

Representative Embodiments

Example 1

The analytical framework provided above is used to illustrate a representative coding method. Such a method can be described using a hexagonal grid and whose vertices are assigned single qubits of a set of qubits. Edges of hexagons in each of the three directions defined by the hexagonal grid are assigned a corresponding quantum operator referred to herein as a "check." The edges can be assigned edge-direction labels corresponding the checks. In addition, connections of qubits (which also correspond to connections of vertices) are assigned connection labels based on labeling of nearest neighbor hexagons intersect by extending hexagon edges. As discussed below, connection labels are used to define three coding stages that define a coding round (hereinafter simply "round"). The particular arrangement illustrated is for convenient explanation and other arrangements and labelings can be used. Because a qubit is assigned to each vertex, in the description, checks or other operators may be referred to as being applied to a vertex meaning that the check or other operator is applied to the qubit associated with the vertex. The geometric description is provided as a convenient way to set forth the steps used.

Referring again to FIG. 1B, a hexagonal grid such as a hexagonal grid portion 150 of FIG. 1B is defined in which each hexagon is assigned one of a first, second, or third hexagon label such that each hexagon is surrounded by hexagons having different hexagon labels. A connection label is assigned to each pair of qubits (i.e., each pair of vertices) in the set of qubits with the connection label corresponding to a label of nearest hexagons connected by extending a hexagon edge from the vertices of the hexagons. In this example, "0," "1," and "2," are used as hexagon labels.

Referring again to FIG. 1A, edges of hexagons such as representative hexagon 102 are labeled according to edge direction. As shown, the edges of the hexagon 102 are assigned edge-direction labels X, Y, Z for convenience, but the X, Y, Z labels need not correspond to directions of coordinate axes and arbitrary edge-direction labels such as A, B, C or I, II, III or other indicators can be used. Edge directions are generally associated with check operators ("checks") and it can be convenient to use X, Y, Z labels especially for examples in which the X, Y, Z labeled edges are associated with products of the two qubit Pauli operators XX, YY, ZZ, respectively. Generally, X, Y, Z refer to checks associated with corresponding edges which need not be XX, YY, ZZ.

Generally each edge is associated with a check that is defined by a product of two operators, subject to a certain condition that. I will give below. Since each check is based on a product of 2 operators, there are 9 available checks: XX, XY, XZ, YX, YY, YZ, ZX, ZY, ZZ. These checks are ordered in that one of these two operators is associated with one of two vertices and the other operator is associated with the other vertex. An arbitrary order can be selected such as, for example, YX means Pauli Y at the first vertex and Pauli X at the second vertex. Now the condition is simple: it is that on every vertex, each check involving that vertex uses a different Pauli operator on that vertex. So choosing XX, YY, ZZ on the edges suffices, as then the three operators are different. But other choices are possible.

As shown in FIG. 1B, a connection of a pair of vertices (i.e., qubit locations in the hexagonal grid) is labeled based on the hexagonal cell labels of the nearest hexagonal cells that intersect an extension of an edge connecting the vertices. For example, an edge 105 connects vertices 105A, 105B and the edge 105 can be extended into nearest neighbor hexagonal cells 115, 116 that are labeled "0" so that the edge 105 is assigned a connection label "0." Because the edge 105 is parallel to the hexagon edge Z-direction as shown in FIG. 1A, the edge 105 can be denoted as a Z0 edge. Other representative 0-connection labeled edges such as edges 104, 106 are associated with a Y check and an X check, respectively, and can be referred to as a Y0 edge and an X0 edge. Representative 2-connection labeled edges such as edges 108, 109, 110 can be referred to as Y2, X2, and Z2 edges, respectively. Other edges can be labeled in the same manner to produce X0, X1, X2, Y0, Y1, Y2, Z0, Z1, Z2 labeled qubit connections (i.e., vertex connections).

As shown in FIG. 1B, the vertex 105B is associated with a 0-connection label to vertex 105A. The vertex 105B is also associated with a 2-connection to a vertex 105C defined by cells 116, 117, 119 and with a 1-connection to a vertex 105D. The code is applied by applying the appropriate checks to the qubits associated with each of the 0-connection edges, followed by the 1-connection edges, and finally, the 2-connection edges. All qubits (vertices) are used for the 0-, 1-, and 2-connections. This cycle can be repeated.

Figure 1C:
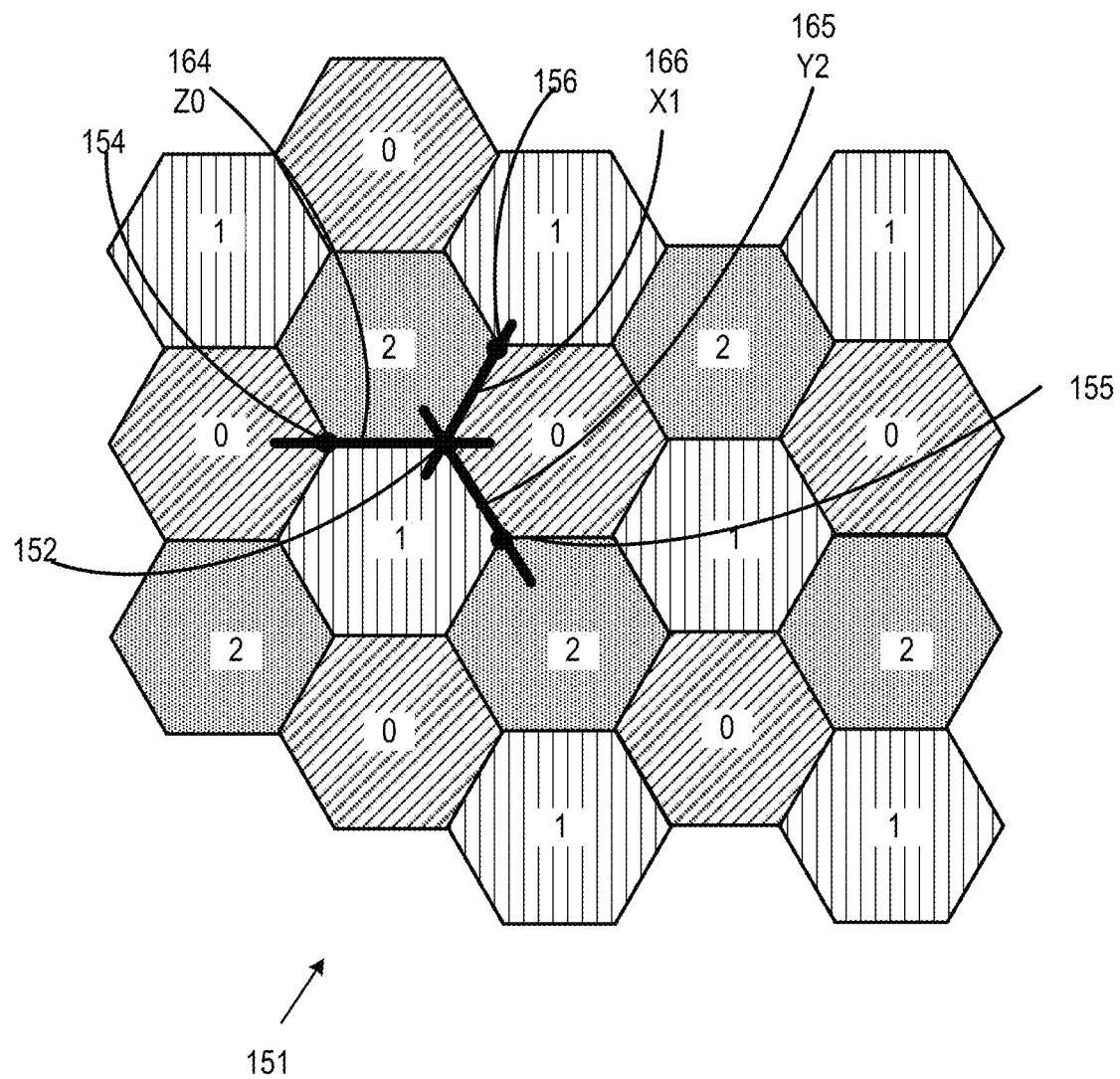

FIG. 1C illustrates a portion 151 of a hexagonal grid similar to that of FIG. 1B and illustrates processing of a representative qubit (vertex) 152 for 0-, 1-, and 2-connections. The representative qubit 152 is adjacent a first qubit 154, a second qubit 155, and a third qubit 156 situated at vertices of the hexagonal grid. A connection 164 connects the representative qubit 152 and the first qubit 154 and is a 0-connection on a Z-directed edge and thus is a Z0 connection. A connection 165 connects the representative qubit 152 and the second qubit 155 and is a 2-connection on a Y-directed edge and thus is a Y2 connection. A connection 166 connects the representative qubit 152 and the third qubit 156 and is a 1-connection on an X-directed edge and thus is an X1 connection. In applying the code in three rounds, the representative qubit. 152 participates in each round with a different connection. In this example, for the 0-connection the Z check is used, for the 1-connection, the X check is used, and for the 2-connection, the Y check is used. For examples in which the checks are XX, YY, ZZ, the X, Y, Z operators are applied to the qubit 152 and the respective connected qubit (i.e., one of qubits 156, 155, 154, respectively). In a 0-connection round, the ZZ check is applied, i.e., the Z operator is applied to both of the qubits 152, 154. In a 1-connection round, the XX check is applied, i.e., the X operator is applied to both of the qubits 152, 156. In a 2-connection round, the YY check is applied, i.e., the Y operator is applied to both of the qubits 152, 155. For other selections of checks (such as XY), different operators are applied to the different qubits in the rounds.

The assignment of connection labels and edge-direction (check) labels is arbitrary and the particular labeling and ordering is used for convenient illustration. The assignment of qubits to the vertices is also arbitrary. In some examples, a hexagonal grid is defined on a surface of a torus. As noted above, the arrangement of qubits at vertices of a hexagonal lattice is used only to establish the appropriate coding operations and does not correspond to a physical arrangement of qubits. The coding operations can be specified in other ways if more convenient.

Example 2

Figure 9:
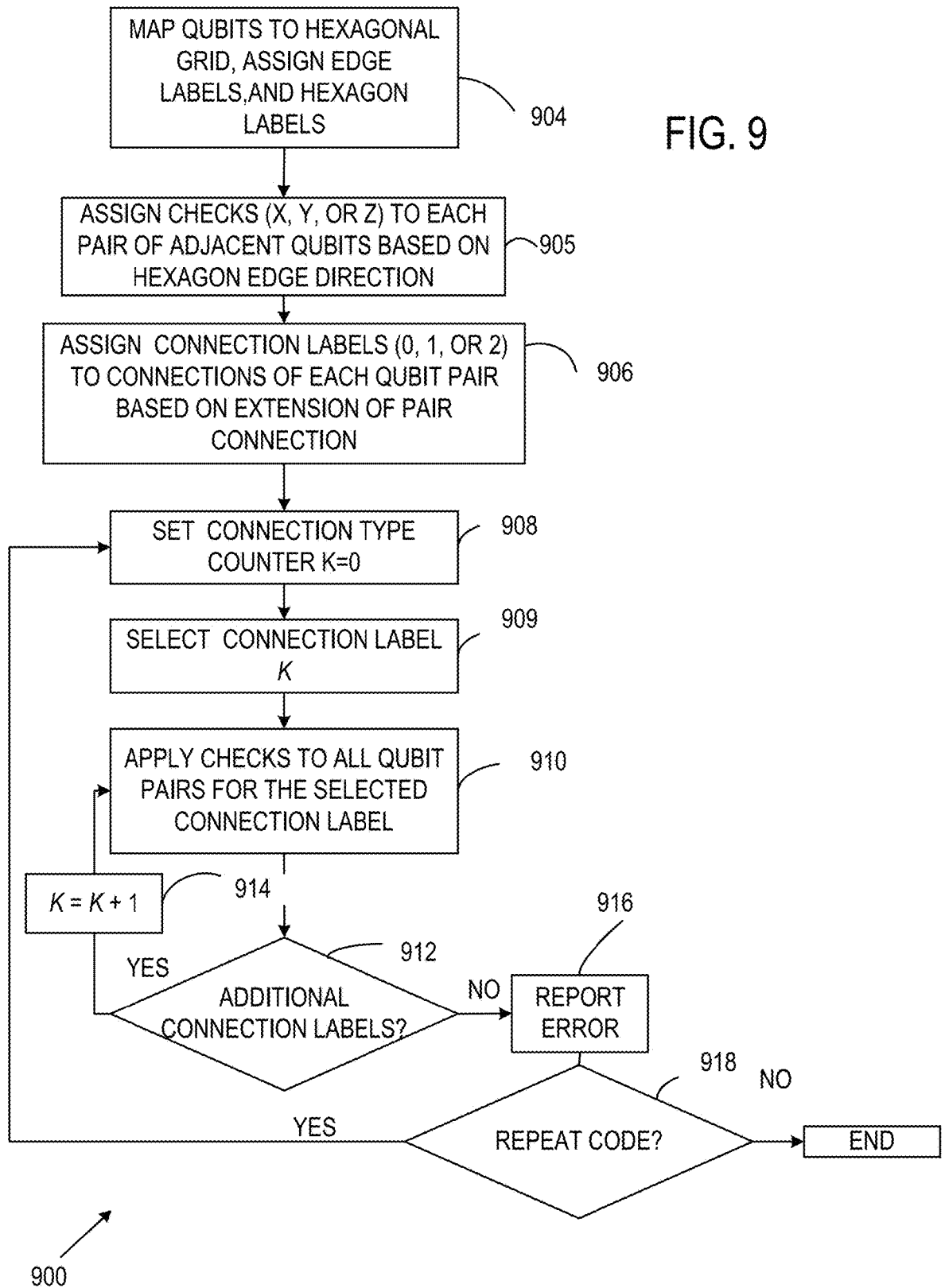
FIG. 9 illustrates a representative method of implementing the disclosed approaches to error detection.

Referring to FIG. 9, a representative method 900 includes mapping qubits to a hexagonal grid, associating edge labels with hexagon edges, and assigning each hexagon a hexagon label so that hexagons do not share edges with other hexagons having the same hexagon label at 904. For example, the edges can be labeled a, b, c or other labels can be used and the hexagons can be labeled A, B, C or otherwise labeled. At 905 checks are assigned to all pairs of adjacent qubits based on the edge labels of the hexagonal edges that connect the paired qubits. At 906, connection labels are assigned to the connections of each pair corresponding to the hexagon label of the adjacent hexagons connected by an extension of the edge connecting the paired qubits. At 908, a connection type counter K is initialized (for example, set to 0) and at 909, a connection label is selected correspond to the type counter K. At 910, the appropriate checks are applied to all qubit pairs having the selected connection label. The checks are based the edge directions and all edge directions are used and a check of some kind is applied to every qubit. At 912, it is determined if checks are to be applied to qubits associated with different connection labels. If so, at 914, the connection type counter K is incremented and similar processing of applying checks is performed. In no additional connection labels are needed as determined at 914, errors (if present) are reported at 916. If the code is to be applied again as determined at 918, processing returns to 908. Generally, application of the code requires applying checks based on all three connection types (labels), i.e. three rounds are used.

Example 3

Figure 10:
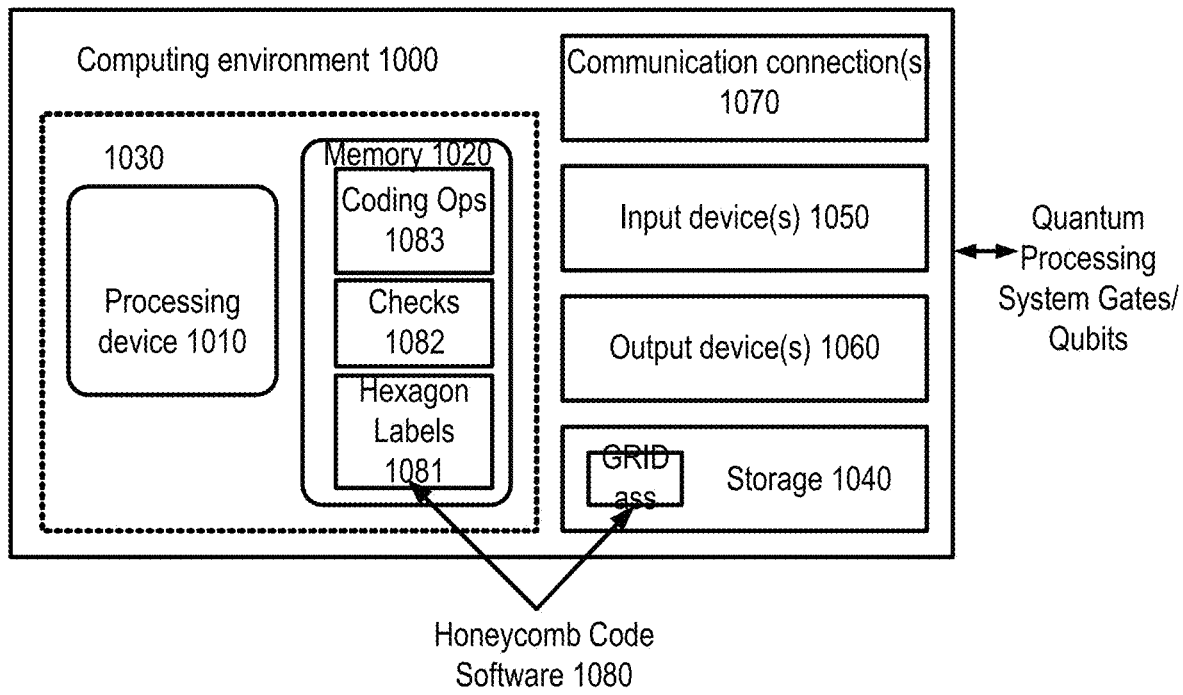
FIG. 10 illustrates a representative classical computing environment for specifying a honeycomb code and providing a suitable specification to a quantum processing system.

FIG. 10 illustrates a generalized example of a suitable computing environment 1000 in which several of the described embodiments can be implemented. The computing environment 1000 is not intended to suggest any limitation as to the scope of use or functionality of the disclosed technology, as the techniques and tools described herein can be implemented in diverse general-purpose or special-purpose environments that have computing hardware.

With reference to FIG. 10, the computing environment 1000 includes at least one processing device 1010 and memory 1020. In FIG. 10, this most basic configuration 1030 is included within a dashed line. The processing device 1010 (e.g., a CPU or microprocessor) executes computer-executable instructions. In a multi-processing system, multiple processing devices execute computer-executable instructions to increase processing power. The memory 1020 may be volatile memory (e.g., registers, cache, RAM, DRAM, SRAM), non-volatile memory (e.g., ROM, EEPROM, flash memory), or some combination of the two. The memory 1020 stores software 1080 implementing tools for implementing embodiments of the disclosed technology (e.g., any of the disclosed techniques for implementing error correcting qubits or generating codes for such circuits).

The computing environment can have additional features. For example, the computing environment 1000 includes storage 1040, one or more input devices 1050, one or more output devices 1060, and one or more communication connections 1070. An interconnection mechanism (not shown), such as a bus, controller, or network, interconnects the components of the computing environment 1000. Typically, operating system software (not shown) provides an operating environment for other software executing in the computing environment 1000, and coordinates activities of the components of the computing environment 1080.

The storage 1040 can be removable or non-removable, and includes one or more magnetic disks (e.g., hard drives), solid state drives (e.g., flash drives), magnetic tapes or cassettes, CD-ROMs, DVDs, or any other tangible non-volatile storage medium which can be used to store information and which can be accessed within the computing environment 1000. The storage 1040 can also store instructions for the software 1080 generating or implementing the codes as disclosed herein (e.g., honeycomb or ladder codes). As shown, the memory 1020 stores instructions at 1083 for causing coding operations to be carried out as well as check operation definitions at 1082 and hexagon labeling and labeling procedures at 1081.

The input device(s) 1050 can be a touch input device such as a keyboard, touchscreen, mouse, pen, trackball, a voice input device, a scanning device, or another device that provides input to the computing environment 1000. The output device(s) 1060 can be a display device (e.g., a computer monitor, laptop display, smartphone display, tablet display, netbook display, or touchscreen), printer, speaker, or another device that provides output from the computing environment 1000.

The communication connection(s) 1070 enable communication over a communication medium to another computing entity. The communication medium conveys information such as computer-executable instructions or other data in a modulated data signal. A modulated data signal is a signal that has one or more of its characteristics set or changed in such a manner as to encode information in the signal. By way of example, and not limitation, communication media include wired or wireless techniques implemented with an electrical, optical, RF, infrared, acoustic, or other carrier.

As noted, the various methods or compilation/synthesis techniques for implementing the disclosed coding methods can be described in the general context of computer-readable instructions stored on one or more computer-readable media. Computer-readable media are any available media (e.g., memory or storage device) that can be accessed within or by a computing environment. Computer-readable media include tangible computer-readable memory or storage devices, such as memory 1020 and/or storage 1040, and do not include propagating carrier waves or signals per se (tangible computer-readable memory or storage devices do not include propagating carrier waves or signals per se).

Various embodiments of the methods disclosed herein can also be described in the general context of computer-executable instructions (such as those included in program modules) being executed in a computing environment by a processor. Generally, program modules include routines, programs, libraries, objects, classes, components, data structures, and so on, that perform particular tasks or implement particular abstract data types. The functionality of the program modules may be combined or split between program modules as desired in various embodiments. Computer-executable instructions for program modules may be executed within a local or distributed computing environment.

Example 4

Figure 11:
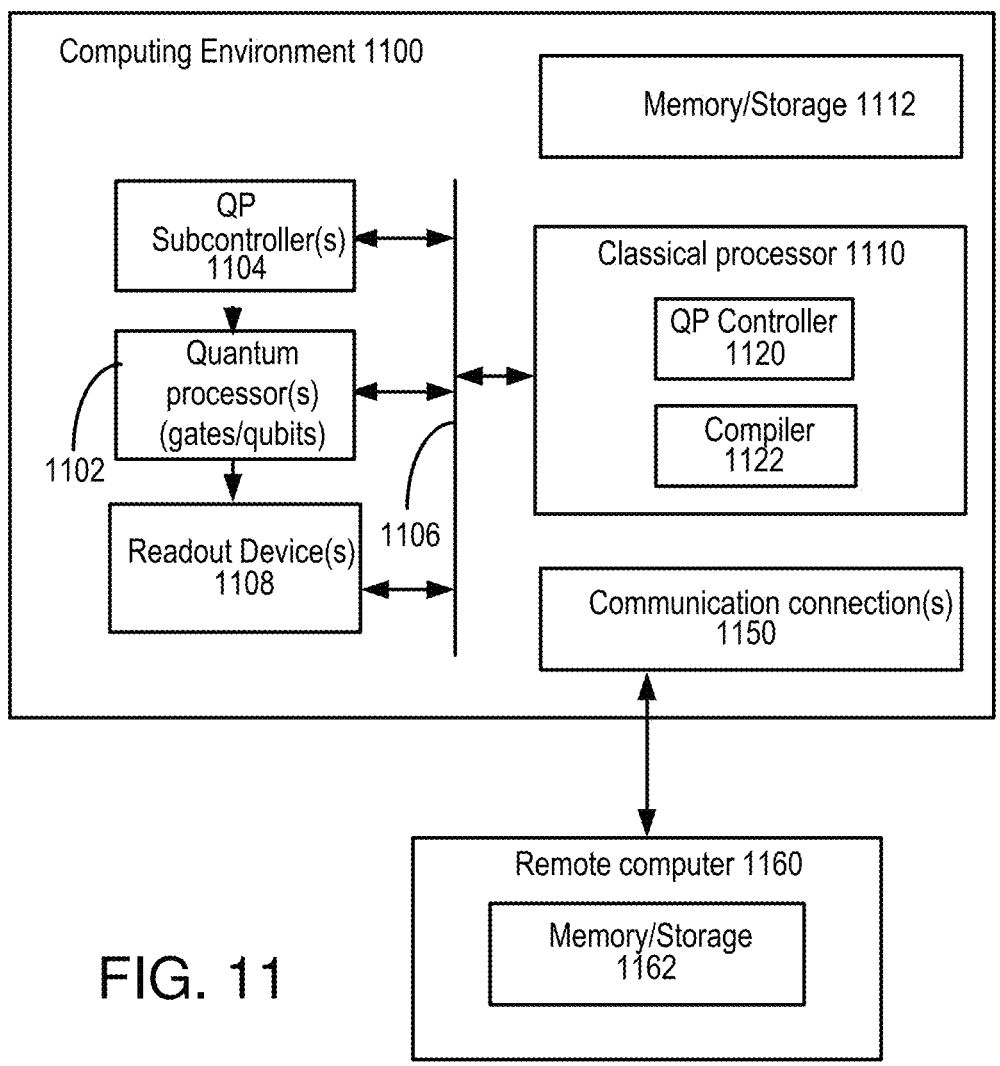
FIG. 11 illustrates a classical processing system coupled to a quantum processor configured for applying the disclosed codes.

With reference to FIG. 11, an exemplary system for implementing the disclosed technology includes computing environment 1100. In computing environment 1100, a compiled quantum computer circuit description, which can include quantum computer circuit description data for implementing any of the error detection techniques (e.g., honeycomb code techniques) as disclosed herein, can be used to program (or configure) one or more quantum processing units such that the quantum processing unit(s) implement the circuit described by the quantum computer circuit description. As noted, the quantum computer circuit description can implement any of the coding techniques for arbitrary quantum architectures (e.g., Majorana-based systems) as discussed herein.

The environment 1100 includes one or more quantum processing units 1102 and one or more readout device(s) 1108. The quantum processing unit(s) execute quantum circuits that are precompiled and described by the quantum computer circuit description. The quantum processing unit(s) can be a topological quantum architecture (e.g., a topological quantum computing device using Majorana zero modes). The precompiled quantum circuits (including, for example, selections of any of the codes and checks) can be sent into (or otherwise applied to) the quantum processing unit (s) via control lines 1106 at the control of quantum processor controller 1120. The quantum processor controller (QP controller) 1120 can operate in conjunction with a classical processor 1110 (e.g., having an architecture as described above with respect to FIG. 2) to implement the desired quantum computing process. In the illustrated example, the QP controller 1120 further implements the desired quantum coding process (i.e., application of the checks and confirming measurements) via one or more QP subcontrollers 1104 that are specially adapted to control a corresponding one of the quantum processor(s) 1102. For instance, in one example, the quantum controller 1120 facilitates implementation of the compiled quantum circuit by sending instructions to one or more memories (e.g., lower-temperature memories), which then pass the instructions to low-temperature control unit(s) (e.g., QP subcontroller(s) 1104) that transmit, for instance, pulse sequences representing the gates to the quantum processing unit(s) 1102 for implementation. In other examples, the QP controller(s) 1120 and QP subcontroller(s) 1104 operate to provide appropriate magnetic fields, encoded operations, or other such control signals to the quantum processor(s) to implement the operations of the compiled quantum computer circuit description. The quantum controller(s) can further interact with readout devices 1108 to help control and implement the desired quantum computing process (e.g., by reading or measuring out data results from the quantum processing units once available, etc.)

With reference to FIG. 11, compilation is the process of translating a high-level description of a quantum algorithm into a quantum computer circuit description comprising a sequence of quantum operations or gates, which can include the coding methods as disclosed herein. The compilation can be performed by a compiler 1122 using a classical processor 1110 of the environment. 1100 which loads the high-level description from memory or storage devices 1112 and stores the resulting quantum computer circuit description in the memory or storage devices 1112.

In other embodiments, compilation and/or code generation implementation can be performed remotely by a remote computer 1100 (e.g., a computer having a computing environment as described above) which stores the resulting quantum computer circuit description in one or more memory or storage devices 1162 and transmits the quantum computer circuit description and or training instructions to the computing environment 1100 for implementation in the quantum processing unit(s) 1102. Still further, the remote computer 1100 can store the high-level description and/or Majorana fermion code generating (or implementing) instructions in the memory or storage devices 1162 and transmit the high-level description and/or instructions to the computing environment 1100 for compilation and use with the quantum processor(s). In any of these scenarios, results from the computation performed by the quantum processor(s) can be communicated to the remote computer after and or during the computation process. Still further, the remote computer can communicate with the QP controller(s) 1120 such that the quantum computing process (including any compilation, error correction, and/or QP processor control procedures) can be remotely controlled by the remote computer 1160. In general, the remote computer 1160 communicates with the QP controller(s) 1120 and/or compiler/synthesizer 1122 via communication connections 1150.

In particular embodiments, the environment 1100 can be a cloud computing environment, which provides the quantum processing resources of the environment 1100 to one or more remote computers (such as remote computer 1160) over a suitable network (which can include the internet).

General Considerations

Having described and illustrated the principles of the disclosed technology with reference to the illustrated embodiments, it will be recognized that the illustrated embodiments can be modified in arrangement and detail without departing from such principles. For instance, elements of the illustrated embodiments shown in software may be implemented in hardware and vice-versa. Also, the technologies from any example can be combined with the technologies described in any one or more of the other examples. It will be appreciated that procedures and functions such as those described with reference to the illustrated examples can be implemented in a single hardware or software module, or separate modules can be provided. The particular arrangements above are provided for convenient illustration, and other arrangements can be used. For example, while checks are implemented as Pauli operators, Pauli operators can be synthesized using other operators so that various gates can be used, not just Pauli gates. While the disclosed coding methods are particularly suitable for Majorana based systems at the checks correspond to native operations, the methods can be used with other quantum systems as well.

We claim:

1. A quantum computing system, comprising:
a plurality of gates;
a plurality of tetrons; and
a processing device coupled to apply a honeycomb code and identify an error based on the applied honeycomb code, wherein the honeycomb code is applied based on measurement of checks associated with respective honeycomb edge directions and connections of paired qubits defined by the plurality of tetrons that are adjacent as assigned to vertices of the honeycomb.

2. The quantum computing system of claim 1, wherein the checks are first, second, and third checks and are selected from XX, YY, ZZ, XY, YX, XZ, ZX, YZ, ZY, wherein X, Y, Z, correspond to single qubit Pauli operators.

3. The quantum computing system of claim 1, wherein the checks are first, second, and third checks that are the two qubit Pauli X operator, the two qubit Pauli Y operator, and the Pauli two qubit Z operator.

4. The quantum computing system of claim 1, wherein the checks are first, second, and third checks that are implemented by two-qubit measurements.

5. The quantum computing system of claim 1, wherein the checks are first, second, and third checks that are implemented by two-qubit Clifford gates and single qubit measurements.

6. The quantum computing system of claim 1, wherein the honeycomb code is based on a hexagonal lattice defined on a three dimensional surface or on a planar hexagonal lattice.

7. The quantum computing system of claim 1, wherein the processing device is operable to identify an error based on the application of one or more of the checks.

8. The quantum computing system of claim 1, further comprising at least one computer-readable storage device coupled to the processing device and having controller-executable instructions that are operable to:
establish the honeycomb code by assigning the qubits defined by the tetrons to a hexagonal lattice, assigning checks to edges of the hexagonal lattice based on edge directions, and determining connections of pairs of adjacent qubits with adjacent cells of the hexagonal lattice; and
control a quantum processor to apply the honeycomb code by sequentially applying the associated checks to adjacent pairs of qubits based on the determined connections; and
and identify an error based on application of the honeycomb code.

9. A control system for a quantum computer, comprising:
a processing device; and
at least one computer-readable storage device coupled to the processing device and having processor-executable instructions that are operable to:
measure checks associated with respective honeycomb edge directions and connections of paired qubits in a quantum processor defined by a plurality of tetrons that are adjacent as assigned to vertices of a honeycomb;
apply a honeycomb code in a quantum processor and identify an error based on the applied honeycomb code, wherein the honeycomb code is applied based on the measured checks.

10. The control system for a quantum computer of claim 9, wherein the processor-executable instructions are further operable to control a quantum processor to apply the honeycomb code by sequentially applying the associated checks to adjacent pairs of qubits based on the determined connections.

11. The control system for a quantum computer of claim 10, wherein the checks are first, second, and third checks and are selected from XX, YY, ZZ, XY, YX, XZ, ZX, YZ, ZY, wherein X, Y, Z, correspond to single qubit Pauli operators.

12. The control system for a quantum computer of claim 10, wherein the checks are first, second, and third checks that are the two qubit Pauli X operator, the two qubit Pauli Y operator, and the Pauli two qubit Z operator.

13. The control system for a quantum computer of claim 10, wherein the checks are first, second, and third checks that are implemented by measurements on Majorana tetrons.

14. The control system for a quantum computer of claim 10, wherein the checks are first, second, and third checks that are implemented by two-qubit measurements.

15. The control system for a quantum computer of claim 10, wherein the checks are first, second, and third checks that are implemented by two-qubit Clifford gates and single qubit measurements.

16. The control system for a quantum computer of claim 10, wherein the honeycomb code is based on a hexagonal lattice defined on a three-dimensional surface or on a planar hexagonal lattice.

17. The control system for a quantum computer of claim 10, wherein the processing device is operable to identify an error based on the application of one or more of the checks.

* * * * *